(12) United States Patent
Byrd et al.

(10) Patent No.: US 10,877,217 B2
(45) Date of Patent: Dec. 29, 2020

(54) COPACKAGING OF ASIC AND SILICON PHOTONICS

(71) Applicant: ROCKLEY PHOTONICS LIMITED, London (GB)

(72) Inventors: Gerald Cois Byrd, Shadows Hills, CA (US); David Arlo Nelson, Fort Collins, CO (US); Javid Messian, Sherman Oaks, CA (US); Thomas Pierre Schrans, Temple City, CA (US); Chia-Te Chou, Pasadena, CA (US); Karlheinz Muth, Richardson, TX (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/505,674

(22) Filed: Jul. 8, 2019

(65) Prior Publication Data

US 2020/0073050 A1   Mar. 5, 2020

Related U.S. Application Data

(63) Continuation-in-part of application No. 16/051,237, filed on Jul. 31, 2018, now Pat. No. 10,761,262, which is a continuation-in-part of application No. 15/862,463, filed on Jan. 4, 2018, now Pat. No. 10,365,436.

(Continued)

(51) Int. Cl.
*G02B 6/122* (2006.01)
*H01L 31/02* (2006.01)
*H01L 33/62* (2010.01)
*G02B 6/12* (2006.01)

(52) U.S. Cl.
CPC ........ *G02B 6/122* (2013.01); *H01L 31/02002* (2013.01); *H01L 33/62* (2013.01); *G02B 2006/12085* (2013.01); *G02B 2006/12111* (2013.01)

(58) Field of Classification Search
CPC .............................. G02B 6/122; H01L 33/62
See application file for complete search history.

(56) References Cited

U.S. PATENT DOCUMENTS 6,910,812 B2   6/2005   Pommer et al.
6,958,907 B2   10/2005   Sato et al.
(Continued)

OTHER PUBLICATIONS

"Designing with the AOC 10Gbps TOSA and ROSA", Finisar Application Note AN-2132, Jun. 2, 2015, pp. 1-33, Finisar Corporation, Sunnyvale, California, USA.
(Continued)

*Primary Examiner* — Sung H Pak
*Assistant Examiner* — Hoang Q Tran
(74) *Attorney, Agent, or Firm* — Lewis Roca Rothgerber Christie LLP

(57) ABSTRACT

A system and method for packing optical and electronic components. A module includes an electronic integrated circuit and a plurality of photonic integrated circuits, connected to the electronic integrated circuit by wire bonds or by wire bonds and other conductors. A metal cover of the module is in thermal contact with the electronic integrated circuit and facilitates extraction of heat from the electronic integrated circuit. Arrays of optical fibers are connected to the photonic integrated circuits.

19 Claims, 43 Drawing Sheets

Related U.S. Application Data

(60) Provisional application No. 62/539,929, filed on Aug. 1, 2017, provisional application No. 62/443,576, filed on Jan. 6, 2017.

(56) References Cited

U.S. PATENT DOCUMENTS

| | | | |
|---|---|---|---|
| 7,198,412 B2 | 4/2007 | Hamasaki et al. |
| 7,259,031 B1 | 8/2007 | Dickinson et al. |
| 7,636,522 B2 | 12/2009 | Nagarajan et al. |
| 7,970,280 B2 | 6/2011 | Morton |
| 8,727,508 B2 | 5/2014 | Nystrom et al. |
| 8,971,676 B1 | 3/2015 | Thacker et al. |
| 9,002,155 B2 | 4/2015 | Li et al. |
| 9,031,412 B2 | 5/2015 | Nagarajan et al. |
| 9,064,861 B2 | 6/2015 | Musk |
| 9,112,616 B2 | 8/2015 | McColloch |
| 9,172,468 B2 | 10/2015 | Kurashima |
| 9,217,835 B2 | 12/2015 | Ishiyama et al. |
| 9,322,938 B2 | 4/2016 | Kämmerer et al. |
| 9,435,959 B2 | 9/2016 | Doerr et al. |
| 9,500,821 B2 | 11/2016 | Hochberg et al. |
| 9,866,929 B2 | 1/2018 | Frankel et al. |
| 9,874,688 B2 | 1/2018 | Doerr et al. |
| 10,026,723 B2 | 7/2018 | Evans et al. |
| 10,037,982 B2 | 7/2018 | Evans et al. |
| 10,097,271 B2 | 10/2018 | Doerr |
| 10,120,132 B2 | 11/2018 | Kojima et al. |
| 10,142,712 B2 | 11/2018 | Garcia et al. |
| 10,151,940 B2 | 12/2018 | Guzzon et al. |
| 10,509,165 B2 | 12/2019 | Celo et al. |
| 2002/0176679 A1 | 11/2002 | Nashimoto |
| 2004/0062491 A1 | 4/2004 | Sato et al. |
| 2005/0058408 A1 | 3/2005 | Colgan et al. |
| 2005/0248019 A1 | 11/2005 | Chao et al. |
| 2005/0249509 A1 | 11/2005 | Nagarajan et al. |
| 2006/0088319 A1 | 4/2006 | Morton |
| 2006/0196651 A1 | 9/2006 | Board et al. |
| 2007/0159636 A1 | 7/2007 | Jayaraman |
| 2008/0023722 A1 | 1/2008 | Lee et al. |
| 2010/0166424 A1 | 7/2010 | Nagarajan et al. |
| 2010/0284698 A1 | 11/2010 | McColloch |
| 2011/0204327 A1 | 8/2011 | Hiruma et al. |
| 2011/0226951 A1 | 9/2011 | Kämmerer et al. |
| 2012/0033208 A1 | 2/2012 | Hara et al. |
| 2013/0049018 A1 | 2/2013 | Ramer et al. |
| 2013/0049040 A1 | 2/2013 | Ramer et al. |
| 2013/0049041 A1 | 2/2013 | Ramer et al. |
| 2013/0120505 A1 | 5/2013 | Nystrom et al. |
| 2013/0193304 A1 | 8/2013 | Yu et al. |
| 2013/0308898 A1 | 11/2013 | Doerr et al. |
| 2014/0010551 A1 | 1/2014 | Kurashima |
| 2014/0064659 A1 | 3/2014 | Doerr et al. |
| 2014/0147085 A1 | 5/2014 | Lim |
| 2014/0233166 A1 | 8/2014 | O'Shea |
| 2014/0270629 A1* | 9/2014 | Dutt .................. G02B 6/12 385/14 |
| 2015/0076661 A1 | 3/2015 | Musk |
| 2015/0084490 A1 | 3/2015 | Fujiwara |
| 2015/0098675 A1 | 4/2015 | Ishiyama et al. |
| 2015/0221825 A1 | 8/2015 | Ko et al. |
| 2015/0277069 A1 | 10/2015 | Okamoto et al. |
| 2016/0013866 A1 | 1/2016 | Doerr |
| 2016/0056336 A1 | 2/2016 | Hwang et al. |
| 2016/0062039 A1 | 3/2016 | Zhang et al. |
| 2016/0085038 A1 | 3/2016 | Decker et al. |
| 2016/0111407 A1 | 4/2016 | Krasulick |
| 2016/0238371 A1 | 8/2016 | Lloret Soler et al. |
| 2016/0334594 A1 | 11/2016 | Leigh et al. |
| 2016/0341920 A1 | 11/2016 | Stapleton et al. |
| 2017/0003450 A1 | 1/2017 | Rickman et al. |
| 2017/0075149 A1 | 3/2017 | Guzzon et al. |
| 2017/0194308 A1 | 7/2017 | Evans et al. |
| 2017/0194309 A1 | 7/2017 | Evans et al. |
| 2017/0194310 A1 | 7/2017 | Evans et al. |
| 2018/0023779 A1 | 1/2018 | Seif et al. |
| 2018/0098138 A1 | 4/2018 | Frankel et al. |
| 2018/0196196 A1 | 7/2018 | Byrd et al. |
| 2018/0203187 A1 | 7/2018 | Doerr et al. |
| 2018/0284345 A1 | 10/2018 | Kojima et al. |
| 2018/0284373 A1 | 10/2018 | Lin et al. |
| 2019/0041576 A1 | 2/2019 | Byrd et al. |
| 2019/0081453 A1 | 3/2019 | Meehan et al. |
| 2019/0324201 A1 | 10/2019 | Celo et al. |
| 2020/0064547 A1 | 2/2020 | Goodwill et al. |

OTHER PUBLICATIONS

International Search Report and Written Opinion of the International Searching Authority, dated Apr. 5, 2018, Corresponding to PCT/EP2018/050188, 15 pages.

International Search Report and Written Opinion of the International Searching Authority, dated Nov. 30, 2018, Corresponding to PCT/IB2018/000980, 18 pages.

Web page with photograph, https://community.mellanox.com/servlet/rtaImage?eid=ka21T00000054Vu&feoid=00N5000000AYucA&refid=0EM1T000000uNdV, printed PDF Jan. 17, 2019, 1 page.

U.S. Notice of Allowance dated Apr. 23, 2020, for U.S. Appl. No. 16/051,237, 13 pages.

U.S. Office Action dated Feb. 13, 2020, for U.S. Appl. No. 16/051,237, 32 pages.

U.S. Appl. No. 15/862,463, filed Jan. 4, 2018.

U.S. Appl. No. 16/051,237, filed Jul. 31, 2018.

U.S. Office Action dated Nov. 1, 2018, for U.S. Appl. No. 15/862,463, 15 pages.

U.S. Office Action dated Jan. 7, 2019, for U.S. Appl. No. 16/051,237, 38 pages.

U.S. Office Action dated May 23, 2019, for U.S. Appl. No. 16/051,237, 38 pages.

U.S. Office Action dated Sep. 17, 2019, for U.S. Appl. No. 16/051,237, 37 pages.

* cited by examiner

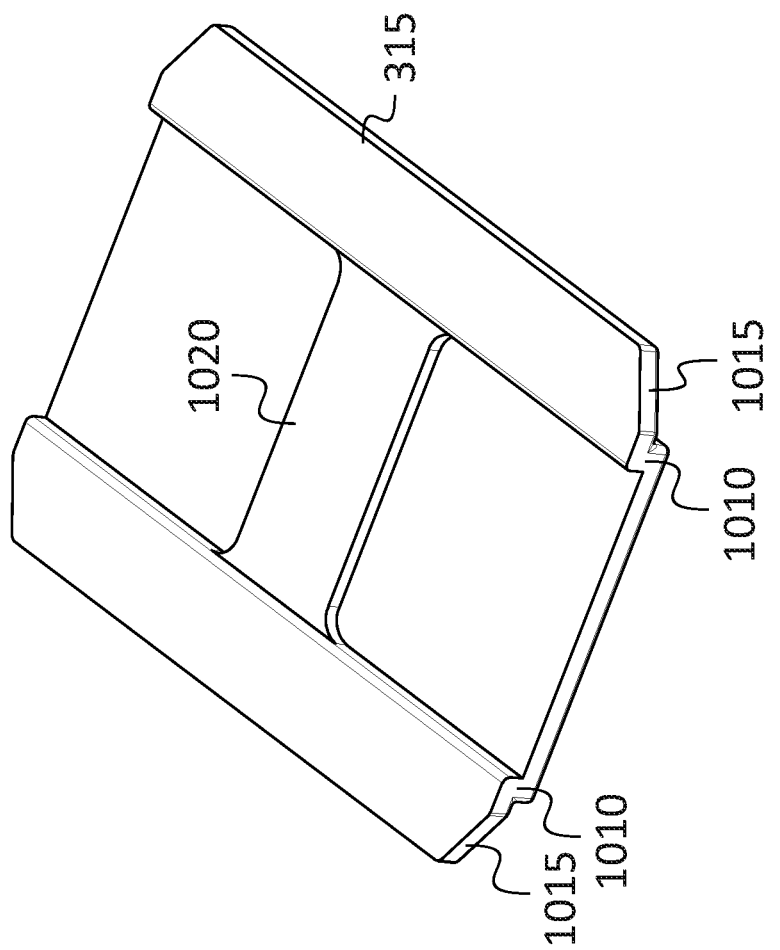

COPACKAGING OF ASIC AND SILICON PHOTONICS

CROSS-REFERENCE TO RELATED APPLICATION(S)

The present application is a continuation-in-part of U.S. patent application Ser. No. 15/862,463, filed Jan. 4, 2018, which claims priority to and the benefit of U.S. Provisional Application No. 62/443,576, filed Jan. 6, 2017, and the present application is a continuation-in-part of U.S. patent application Ser. No. 16/051,237, filed Jul. 31, 2018, which claims priority to and the benefit of U.S. Provisional Application No. 62/539,929, filed Aug. 1, 2017. The entire contents of all documents identified in this paragraph are hereby incorporated herein by reference as if fully set forth herein.

FIELD

One or more aspects of embodiments according to the present invention relate to data processing, and more particularly to a module for performing data processing.

BACKGROUND

Various design considerations may apply in the design of a module including an electronic integrated circuit (IC) and having optical data ports. Such a module may have a plurality of optical inputs (e.g., optical fibers) for receiving optical data, and a plurality of optical outputs (e.g., optical fibers) for transmitting optical data. Photonic integrated circuits may be used to convert the received optical data to electrical data, the electrical data may be processed by an electronic integrated circuit to form output electrical data, and the output electrical data may be converted to optical data by additional photonic integrated circuits. In the design of the module, it may be advantageous for example (i) to keep power conductors short, to reduce voltage drops (e.g., if the electronic integrated circuit operates at 0.9V), (ii) to provide a path for heat to escape from the electronic integrated circuit, and (iii) to provide a benign temperature range for the photonic integrated circuits.

Thus, there is a need for a module providing such advantages.

SUMMARY

Aspects of embodiments of the present disclosure are directed toward a system and method of packaging for electronic and optical components.

According to an embodiment of the present invention there is provided a module, including: a substrate including a plurality of conductive traces and a first plurality of contacts, each contact being electrically connected to a corresponding conductive trace of the plurality of conductive traces; an electronic integrated circuit having a top surface and a bottom surface, and including: a second plurality of contacts on a first portion of a bottom surface of the electronic integrated circuit; a third plurality of contacts on a second portion of the bottom surface of the electronic integrated circuit; and a fourth plurality of contacts on a third portion of the bottom surface of the electronic integrated circuit, each of the contacts of the second plurality of contacts being vertically aligned with and connected to a corresponding contact of the first plurality of contacts, wherein: the second portion of the bottom surface overhangs a first edge of the substrate, and the third portion of the bottom surface overhangs a second edge of the substrate.

In one embodiment, each contact of the first plurality of contacts is secured to a contact of the second plurality of contacts with solder; each of the third plurality of contacts is a wire bond pad; and each of the fourth plurality of contacts is a wire bond pad.

In one embodiment, each of the third plurality of contacts is a wire bond pad, and the module further includes: a first plurality of photonic integrated circuit assemblies, each of the first plurality of photonic integrated circuit assemblies having a wire bond pad adjacent to a contact of the third plurality of contacts; and a plurality of wire bonds, each of the wire bonds connecting a wire bond pad of a photonic integrated circuit assembly of the first plurality of photonic integrated circuit assemblies to a contact of the third plurality of contacts.

In one embodiment, the module includes: a second plurality of photonic integrated circuit assemblies, each of the second plurality of photonic integrated circuit assemblies having a wire bond pad adjacent to a contact of the fourth plurality of contacts; and a plurality of wire bonds, each of the wire bonds connecting a wire bond pad of a photonic integrated circuit assembly of the second plurality of photonic integrated circuit assemblies to a contact of the fourth plurality of contacts.

In one embodiment, the module includes: a plurality of photonic integrated circuit assemblies, each of the plurality of photonic integrated circuit assemblies having a wire bond pad adjacent to a contact of the third plurality of contacts, wherein a photonic integrated circuit assembly of the plurality of photonic integrated circuit assemblies includes: a photonic integrated circuit; and a mode converter adjacent to the photonic integrated circuit and configured to convert between an optical mode of the photonic integrated circuit and an optical mode of an optical fiber, wherein the wire bond pad of the photonic integrated circuit assembly is on the photonic integrated circuit.

In one embodiment, the substrate is an organic substrate.

In one embodiment, the substrate has the shape of an H.

In one embodiment, a contact of the first plurality of contacts is secured to a contact of the second plurality of contacts with a connection selected from the group consisting of a copper pillar and a thermocompression stud bump.

In one embodiment, the module includes: a plurality of photonic integrated circuit assemblies, each of the plurality of photonic integrated circuit assemblies having a wire bond pad adjacent to a contact of the third plurality of contacts, wherein a photonic integrated circuit assembly of the plurality of photonic integrated circuit assemblies includes: a V-groove block having a V-groove securing an optical fiber; and a photonic integrated circuit including the wire bond pad, wherein the photonic integrated circuit has an optical aperture aligned with the optical fiber, and includes a mode converter configured to convert between an optical mode of the photonic integrated circuit and an optical mode of the optical fiber.

In one embodiment, the module includes: a plurality of photonic integrated circuits, each of the plurality of photonic integrated circuits having a wire bond pad adjacent to a contact of the third plurality of contacts, wherein a photonic integrated circuit of the plurality of photonic integrated circuits has a V-groove securing an optical fiber.

In one embodiment, the module includes an upper cover, and having a thermal path, with a thermal resistance of less than 0.1° C./W, between the bottom surface of the electronic integrated circuit and an exterior surface of the upper cover.

In one embodiment, the upper cover includes, on an interior surface of the upper cover, a pedestal, the pedestal being part of the thermal path.

In one embodiment, the module includes a plurality of photonic integrated circuit assemblies, each of the plurality of photonic integrated circuit assemblies being secured to the upper cover.

In one embodiment, the photonic integrated circuit assemblies are secured to a carrier, and the carrier is secured to the upper cover.

In one embodiment, the carrier has a thermal resistance, between any one of the photonic integrated circuit assemblies and the exterior surface of the upper cover, of at least 10° C./W.

In one embodiment, each of the third plurality of contacts is a wire bond pad; the substrate has an otherwise convex shape with one or more cutouts; a first cutout of the one or more cutouts is over the second portion of the bottom surface of the electronic integrated circuit; and the first cutout is configured to allow the formation of wire bonds to the third plurality of contacts when the electronic integrated circuit is secured to the substrate.

In one embodiment, the contacts of the first plurality of contacts are on a first surface of the substrate; the substrate further includes a fifth plurality of contacts, on a second surface of the substrate, opposite the first surface of the substrate; and the contacts of the fifth plurality of contacts form a land grid array.

In one embodiment, the module includes: a plurality of photonic integrated circuit assemblies, each of the plurality of photonic integrated circuit assemblies having a wire bond pad adjacent to a contact of the third plurality of contacts; a first heater, in thermal contact with a first photonic integrated circuit of a photonic integrated circuit assembly of the plurality of photonic integrated circuit assemblies; and a temperature sensor, in thermal contact with the first photonic integrated circuit.

In one embodiment, the module includes: a plurality of photonic integrated circuit assemblies, each of the plurality of photonic integrated circuit assemblies having a wire bond pad adjacent to a contact of the third plurality of contacts; a first heater, integral with a first photonic integrated circuit of a photonic integrated circuit assembly of the plurality of photonic integrated circuit assemblies; and a temperature sensor, integral with the first photonic integrated circuit.

BRIEF DESCRIPTION OF THE DRAWINGS

These and other features and advantages of the present invention will be appreciated and understood with reference to the specification, claims, and appended drawings wherein:

FIG. 10B is a perspective view of a cover, according to an embodiment of the present invention;

FIGS. 1A, 2A, 3A, 4, 5, and 7-23 are to drawn to scale, for a plurality of respective embodiments.

DETAILED DESCRIPTION

The detailed description set forth below in connection with the appended drawings is intended as a description of exemplary embodiments of a module including an electronic integrated circuit and having optical data ports provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
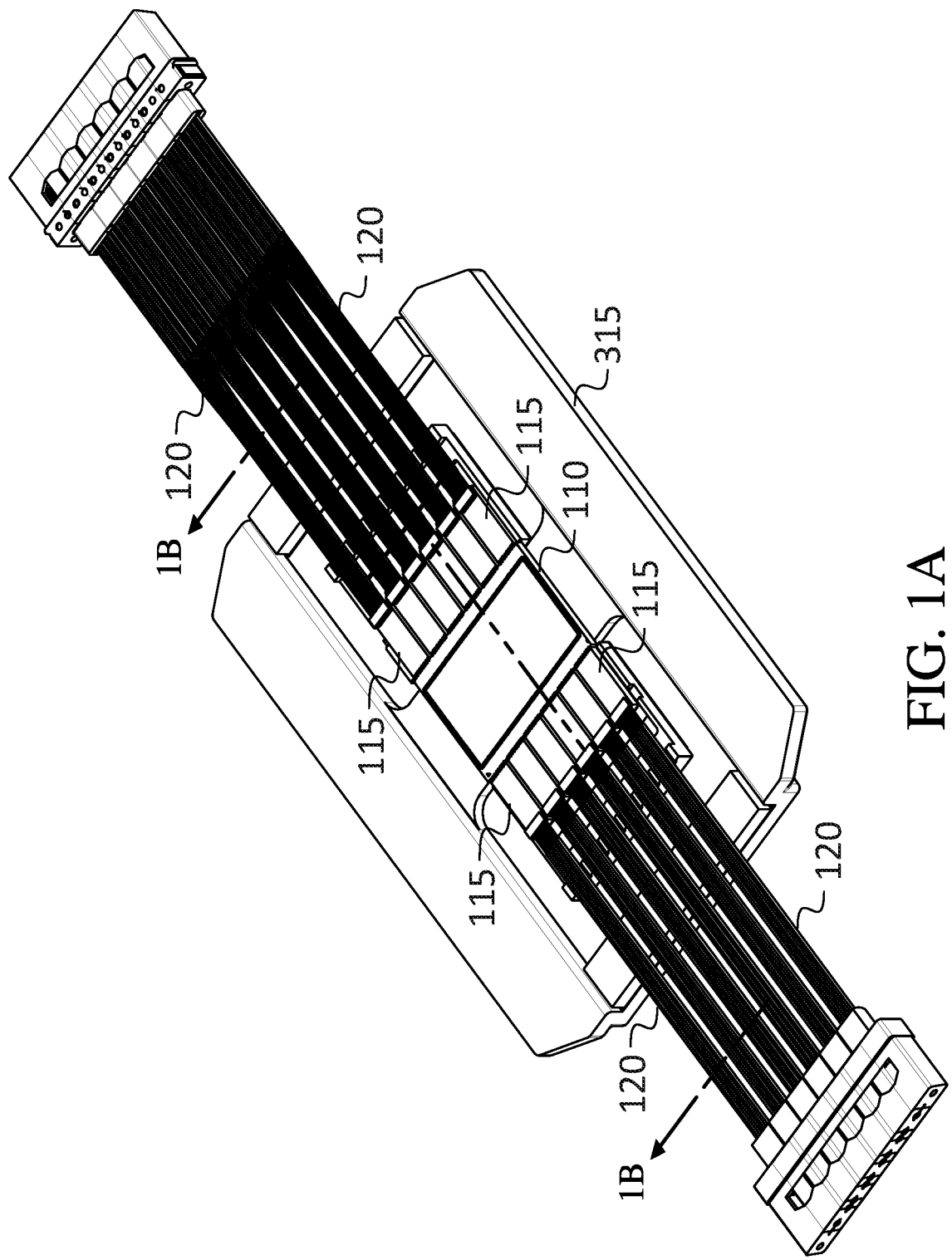
FIG. 1A is a perspective view of a portion of a module, according to an embodiment of the present invention.

FIG. 1A shows an opto-electronic module including an electronic integrated circuit 110 (which may be an application specific integrated circuit (ASIC), and which may be a complementary metal oxide (CMOS) ASIC), and a plurality of photonic integrated circuits (PICs) 115. The photonic integrated circuits 115 are arranged along two opposite edges of the electronic integrated circuit 110, which is substantially rectangular (e.g., it may be rectangular, or it may have the shape of a rectangle with a truncated corner). An array of fibers 120 (i.e., optical fibers) is connected to each of the photonic integrated circuits 115. The fibers 120 may carry high speed digital data (at data rates of more than 1 gigabit/second (Gb/s) per fiber, e.g., at a rate of 25 Gb/s per fiber, net of overhead such as error correcting coding). The photonic integrated circuits 115 may operate as transceivers, converting optically transported digital data to electrical digital data at similar data rates or the same data rates, or vice versa. Accordingly the electronic integrated circuit 110 may have one or more arrays of high-speed electrical connections (e.g., an array of such connections along each of the two opposite edges of the electronic integrated circuit 110 along which the photonic integrated circuits 115 are arranged). The electronic integrated circuit 110 may further have power connections and low-speed input/output (I/O) connections that may be employed, for example, to provide power to the electronic integrated circuit 110 and to set control registers in the electronic integrated circuit 110, respectively. The electronic integrated circuit 110 may be a bare die, i.e., it may not be separately encapsulated in a package (e.g., a plastic package).

Figure 1B:
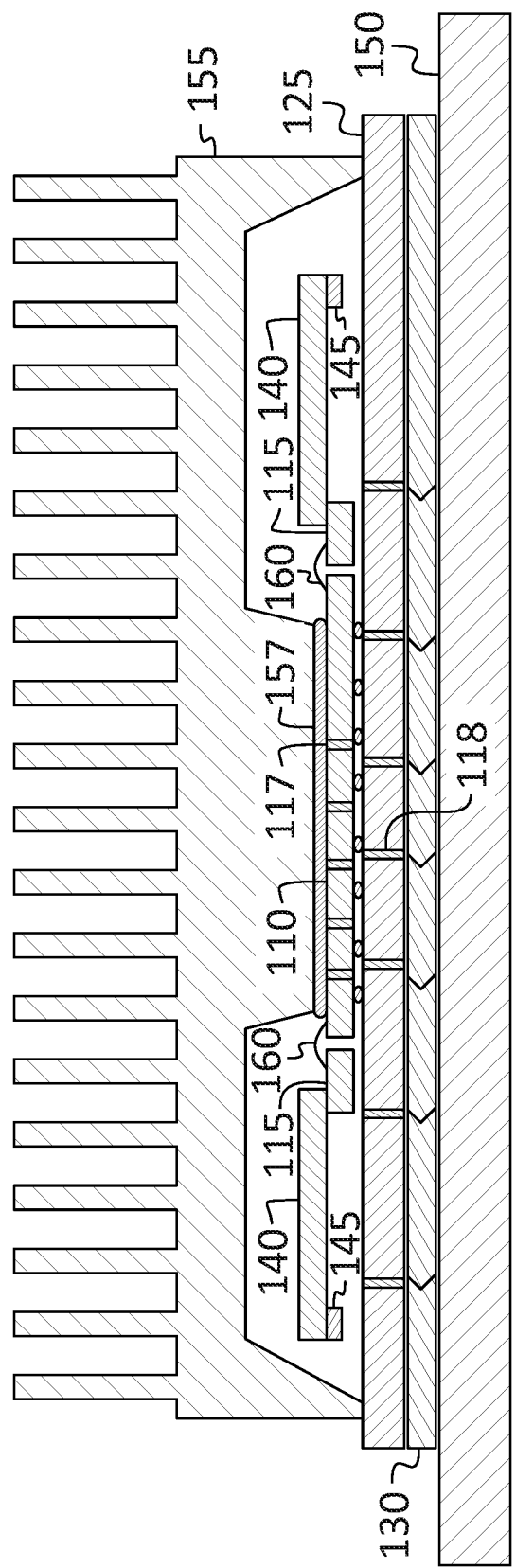
FIG. 1B is a cross-sectional view of a module, according to an embodiment of the present invention.

FIG. 1B shows an enlarged view of a central portion of a cross section taken along the cutting plane 1B-1B shown in FIG. 1A. The embodiment of FIG. 1A is not identical to that of FIG. 1B, but it shows the orientation of the cutting plane used to form FIG. 1B, with respect to the electronic integrated circuit 110, the plurality of photonic integrated circuits 115, and the arrays of fibers 120. Referring to FIG. 1B, in one embodiment the electronic integrated circuit 110 has through silicon vias (TSVs) 117. Power connections and low-speed input/output connections are routed through the TSVs 117, and through a main substrate 125 (which may be a ceramic substrate) to a land grid array (LGA) on the lower surface of the main substrate 125. The main substrate 125 may have an array of solder pads arranged on a relatively fine grid e.g. 150 um to form the contact to the integrated circuit 110. From the solder pad array, the connections may be further routed through the substrate 125 to a land grid array on a relatively coarse pitch of, e.g., 800 microns. An electrical interposer 130 may be used to connect to a host printed circuit board (PCB) 150 (not shown in FIG. 1A). The electrical interposer 130 may be a contact array with compliant contacts capable of forming an electrical contact with features such as those of the land grid array, while absorbing mechanical tolerances inherent in this type of assembly and not requiring that the opto-electronic module be exposed to high temperatures (as soldering the module directly to the PCB 150 would). The host printed circuit board 150 may be fabricated using a lower-cost process not capable of forming fine pitch features. A heat sink 155 may be employed to remove heat from the electronic integrated circuit 110, through a compliant thermal pad 157 between the heat sink 155 and the integrated circuit 110.

The photonic integrated circuits 115 are connected to the electronic integrated circuit 110 by wire bonds 160, which are bonded to wire bond pads on the photonic integrated circuits 115 and on the face of the electronic integrated circuit 110. As used herein, the "face" or "bottom surface" of the electronic integrated circuit 110 (which, in the view of FIG. 1B, faces up) is a surface having a plurality of contacts (e.g., wire bond pads) for forming connections to photonic integrated circuits 115. Each fiber of each array of fibers 120 may be connected to a respective photonic integrated circuit 115 through a beam expander 140, which may be, for example, a tapered waveguide of an array of tapered waveguides on a silicon chip. The same silicon chip may include an array of V-grooves, each configured to receive and align a fiber to the wide end of a respective tapered waveguide. The fibers may be held in place in the array of V-grooves by a block referred to herein as a glass lid 145. The glass lid 145 may be composed of glass; in other embodiments a similar lid composed of a suitable polymer is used instead, to similar effect. The beam expander 140 is configured to transform light propagating with a first, generally smaller, transverse mode to light propagating with a second, generally larger, transverse mode. Although it is referred to herein as a beam "expander", the beam expander 140 may equally well be employed, for light travelling in the opposite direction through it, to transform light propagating with the second, generally larger, transverse mode to light propagating with the first, generally smaller, transverse mode. The beam expander 140 may also be referred to as a "mode converter". In some embodiments (such as the embodiment illustrated, for example, in FIG. 1A) the V-grooves and beam expanders 140 are integrated into the photonic integrated circuits 115.

Figure 2A:
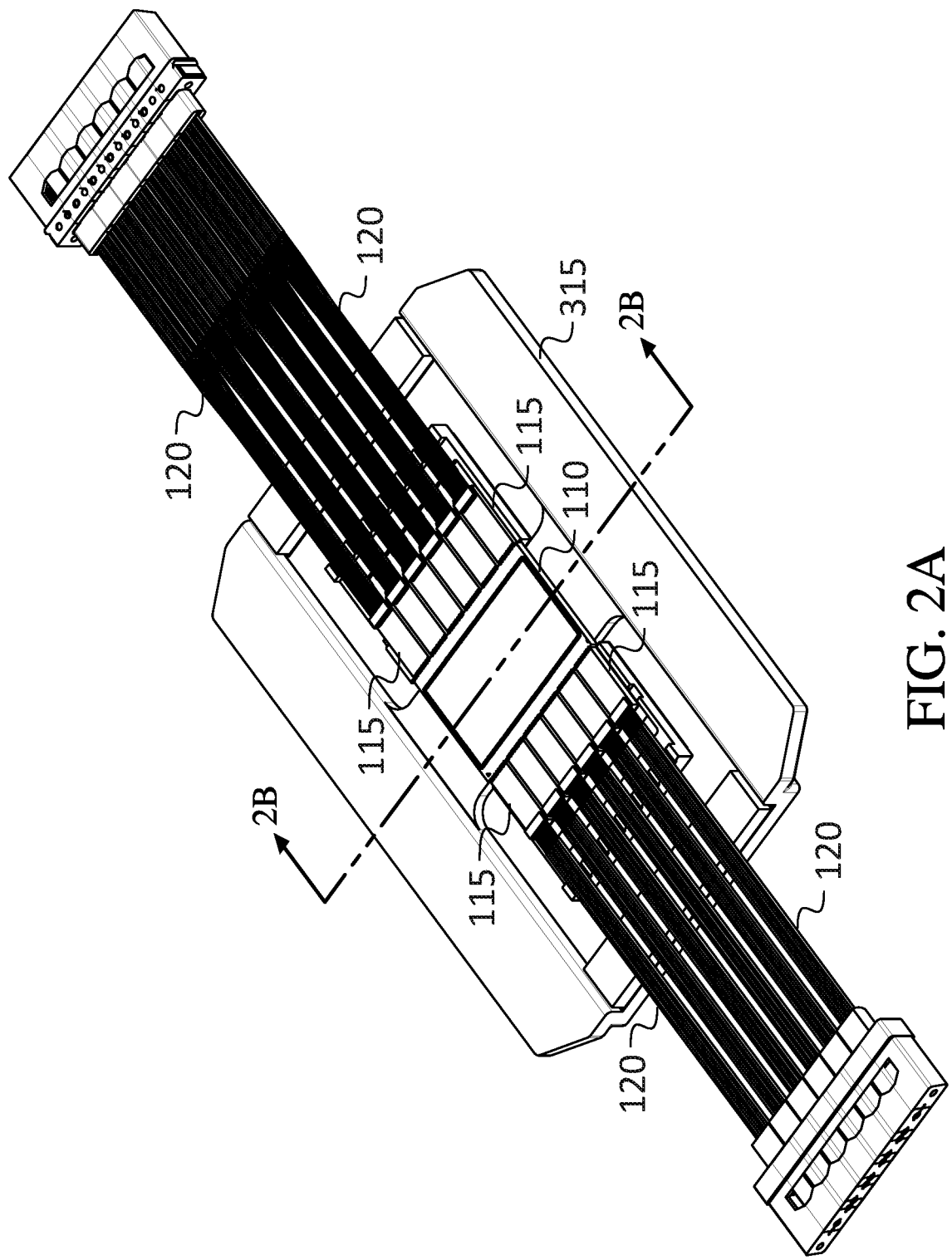
FIG. 2A is a perspective view of a portion of a module, according to an embodiment of the present invention.
Figure 2B:
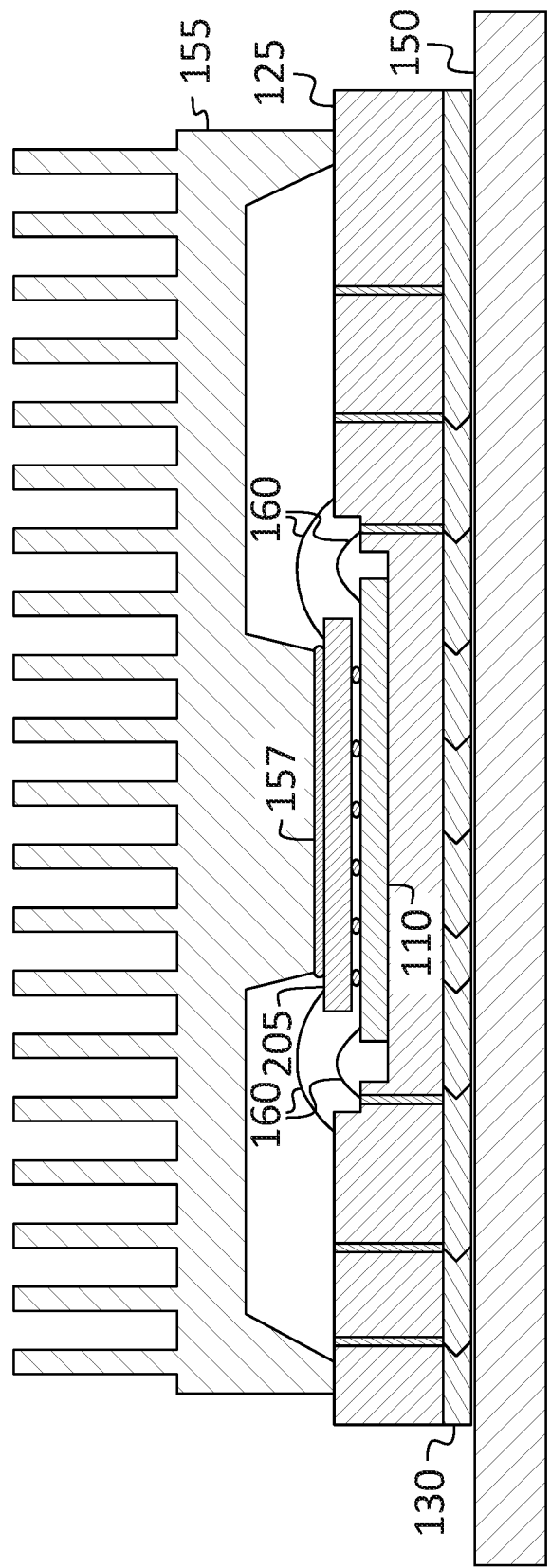
FIG. 2B is a cross-sectional view of a module, according to an embodiment of the present invention.

FIG. 2A shows, like FIG. 1A, an opto-electronic module including an electronic integrated circuit 110, and a plurality of photonic integrated circuits 115, each connected to an array of fibers 120. FIG. 2B shows an enlarged view of a central portion of a cross section taken along the cutting plane 2B-2B shown in FIG. 2A. The embodiment of FIG. 2A is not identical to that of FIG. 2B, but it shows the orientation of the cutting plane used to form FIG. 2B, with respect to the electronic integrated circuit 110, the plurality of photonic integrated circuits 115, and the arrays of fibers 120. In some embodiments (e.g., when the electronic integrated circuit 110 does not have through silicon vias 117), contacts for power and low-speed input/output connections to the electronic integrated circuit 110 may be on the face, or bottom surface, of the electronic integrated circuit 110. In the embodiment of FIG. 2B, a power distribution substrate 205 is connected to the face of the electronic integrated circuit (e.g., by a ball grid array (BGA)), to provide power connections and low-speed input/output (I/O) connections without using TSVs. A heat sink 155 is employed to remove heat from the electronic integrated circuit 110, through the balls of the ball grid array, through the power distribution substrate 205, and through the compliant thermal pad 157. Because the cutting plane used to generate the cross-sectional view of FIG. 2B does not pass through certain elements such as the photonic integrated circuits 115 and the fibers 120, these elements are not visible in FIG. 2B. These elements may be secured in place, and connected together and to the electronic integrated circuit 110, in a manner similar to that shown in FIGS. 1A and 1B.

Figure 3A:
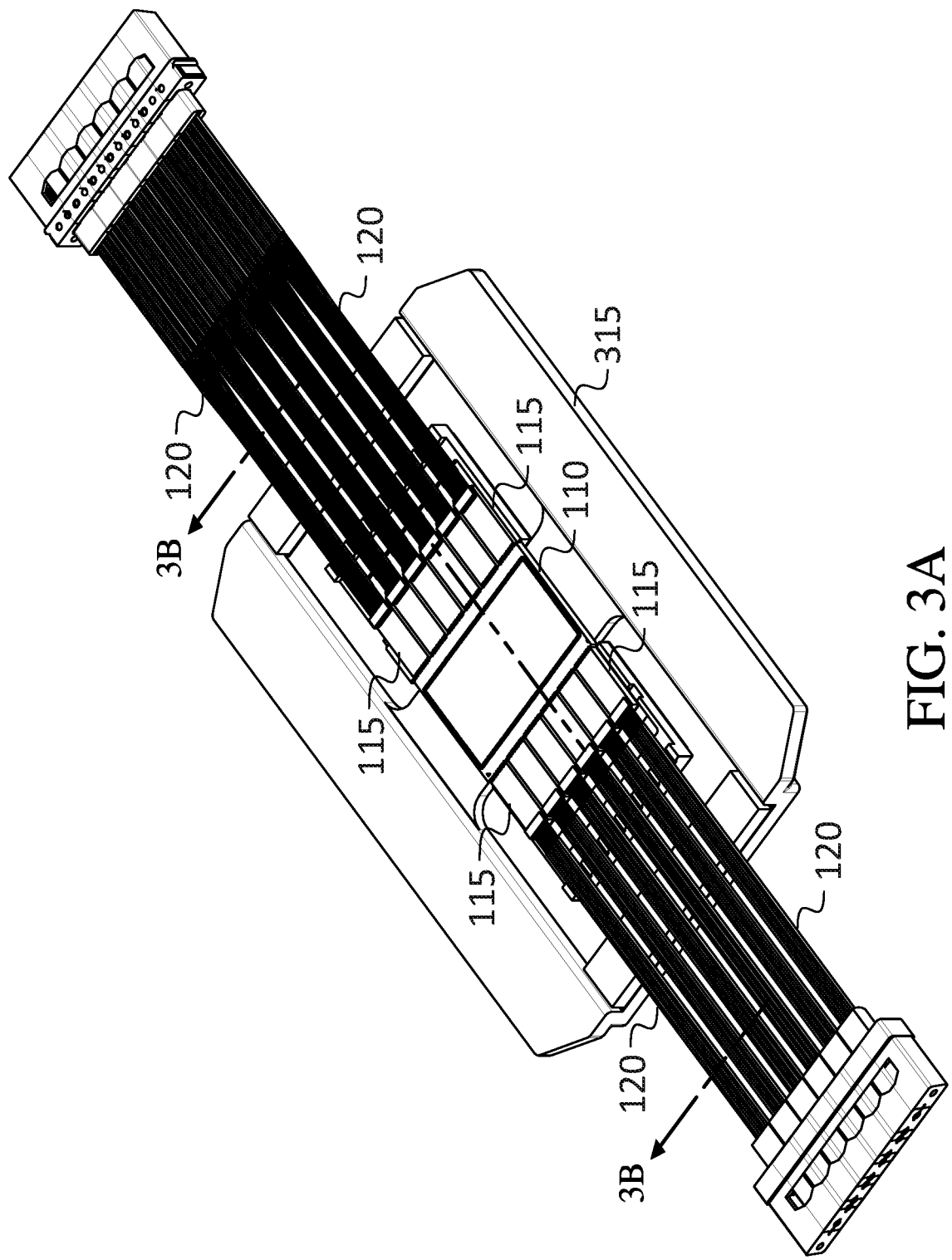
FIG. 3A is a perspective view of a portion of a module, according to an embodiment of the present invention.
Figure 3B:
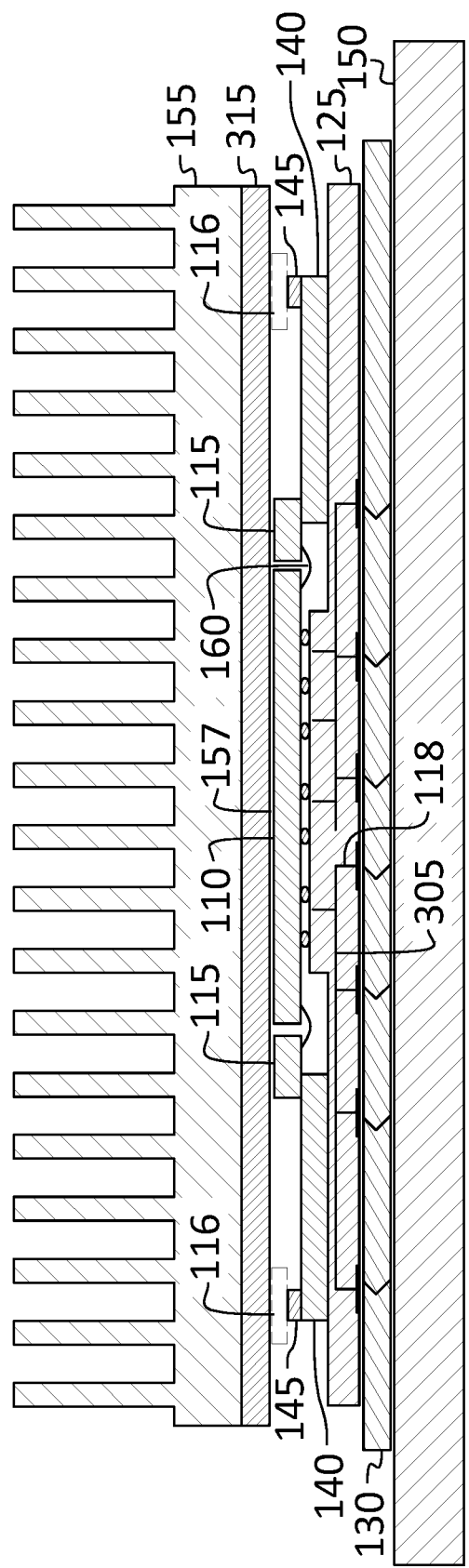
FIG. 3B is a cross-sectional view of a module, according to an embodiment of the present invention.

FIG. 3A shows, like FIG. 1A, an opto-electronic module including an electronic integrated circuit 110, and a plurality of photonic integrated circuits 115, each connected to an array of fibers 120. FIG. 3B shows an enlarged view of a central portion of a cross section taken along the cutting plane 3B-3B shown in FIG. 3A. The embodiment of FIG. 3A is not identical to that of FIG. 3B, but it shows the orientation of the cutting plane used to form FIG. 1B, with respect to the electronic integrated circuit 110, the plurality of photonic integrated circuits 115, and the arrays of fibers 120.

In one embodiment, the main substrate 125 has a first plurality of contacts on an upper surface adjacent to a bottom surface of the electronic integrated circuit 110. The main substrate 125 includes a plurality of conductive traces 305 (e.g., printed circuit board traces) and vias 118 and is configured to provide power connections and low-speed input/output (I/O) connections to the electronic integrated circuit through a second plurality of contacts, on the bottom surface of the electronic integrated circuit (labeled "CMOS chip"), each of which is aligned with, and connected to (e.g., soldered to), a corresponding contact of the first plurality of contacts. In FIG. 3B, the solder contacts are shown schematically as solder balls in the shape they may have before a reflow operation. Wire bonds 160 connect the electronic integrated circuit 110 to photonic integrated circuits 115. A metal cover 315 with a heat sink 155 may be in thermal contact, through a thermal pad 157 (which, as illustrated in FIG. 3B, is too thin to be visible as a separate element), with a surface of the electronic integrated circuit 110. Supports 116 may be used to secure the beam expanders 140 (through the glass lids 145) to the metal cover 315. The opto-electronic module may have a heat transfer surface, e.g., a surface through which heat may be removed from the opto-electronic module (e.g., the upper surface of the metal cover 315, in the view of FIG. 3B). The opto-electronic module may have a high thermal conductivity thermal path from the electronic integrated circuit 110 to the heat transfer surface, so that heat may be extracted from the electronic integrated circuit 110 through the heat transfer surface. In such an embodiment, a separate heat sink 155 may be secured to the heat transfer surface to remove heat from the opto-electronic module (as shown in FIG. 3B), or heat may be removed from the heat transfer surface in some other manner (e.g., using a heat pipe). In some embodiments, the opto-electronic module includes a plurality of heat transfer surfaces.

Figure 4:
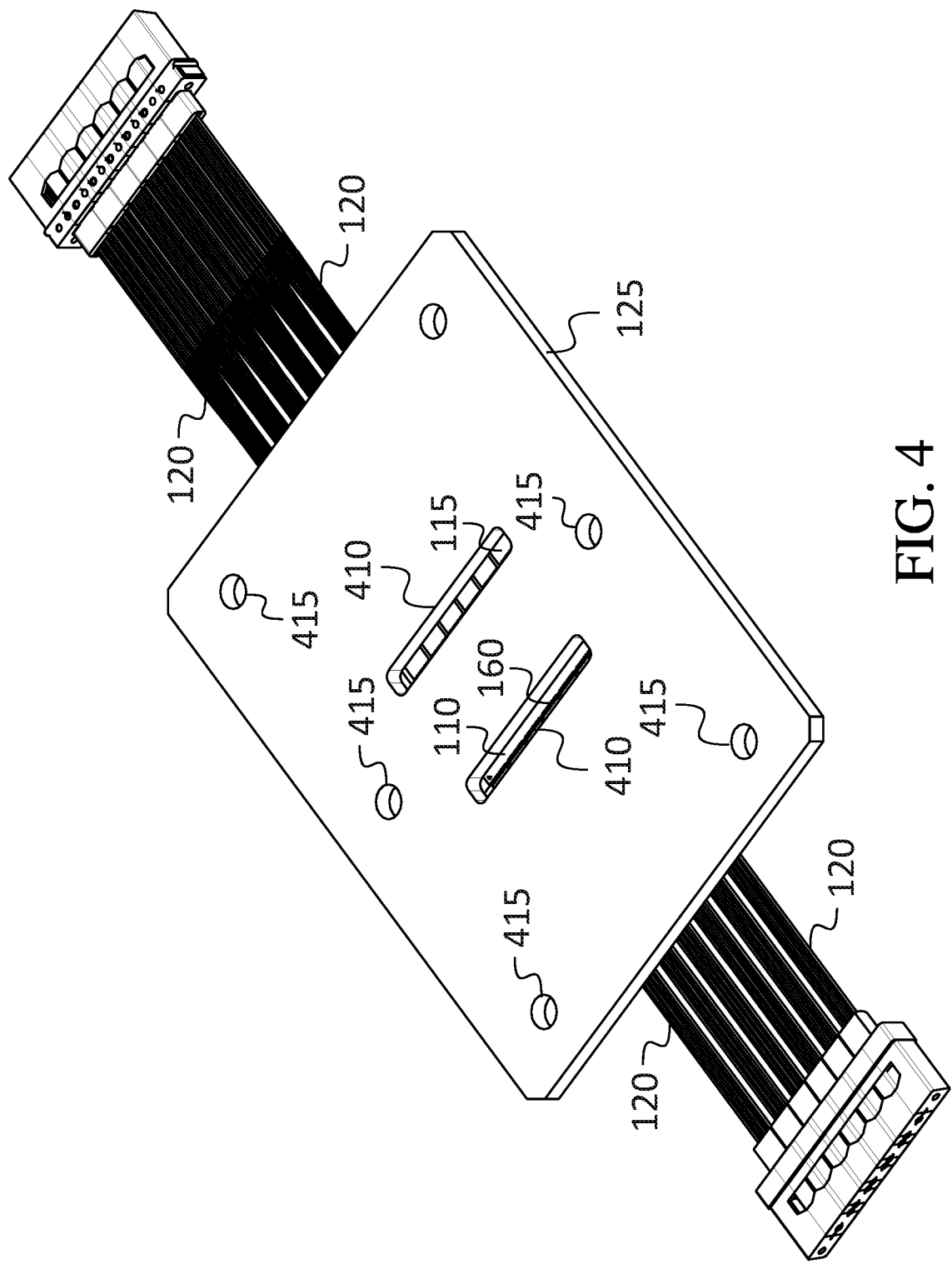
FIG. 4 is a perspective view of a portion of a module, according to an embodiment of the present invention.

Referring to FIG. 4, in an embodiment (such as the embodiment of FIG. 3B) in which the electronic integrated circuit 110 faces the main substrate 125, cutouts 410 may be provided in the substrate to allow wire bonds to be formed after the electronic integrated circuit is soldered to the substrate. The substrate may be an organic substrate (e.g., a reinforced organic polymer, such as fiberglass reinforced epoxy). The main substrate 125 has a shape that has the two oblong cutouts 410 and six circular cutouts 415 and is otherwise convex (being a rectangle with truncated corners).

Figure 5:
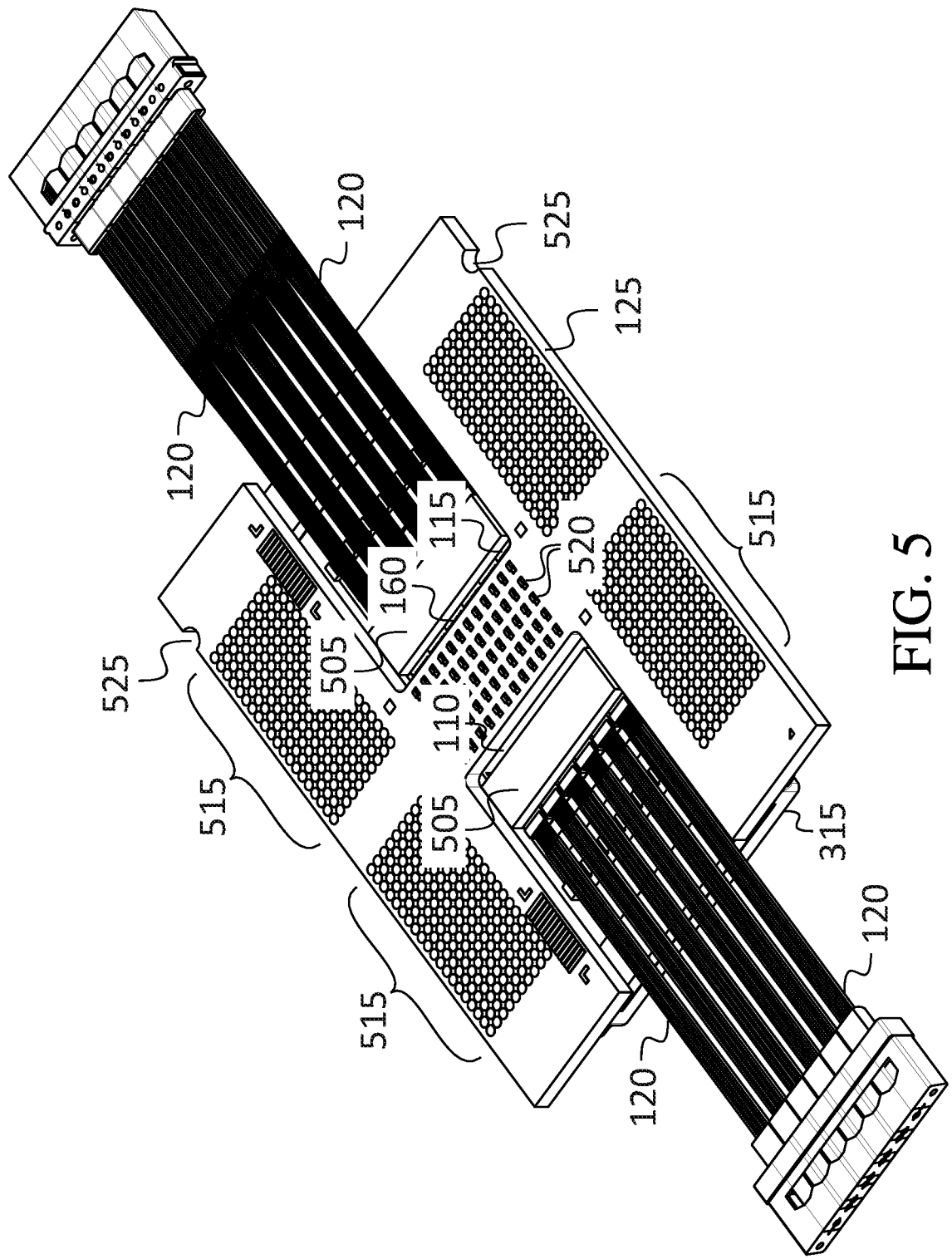
FIG. 5 is a perspective view of a portion of a module, according to an embodiment of the present invention.

Referring to FIG. 5, in some embodiments, the main substrate 125 is in the shape of an "H", providing access for forming wire bonds 160, and also providing access for installing the photonic integrated circuits 115 after the substrate and electronic integrated circuit 110 have been assembled with the metal cover. This shape makes it unnecessary for the main substrate 125 to have a step in thickness, which in the embodiment of FIG. 3B provides space for beam expanders 140. An H shape may be formed by forming two rectangular cutouts 510 (FIG. 9A) in an otherwise convex rectangular shape (or, in the case of the embodiment of FIG. 5, a shape that further has two semicircular cutouts 525). One or more land grid arrays 515 of contacts on the bottom surface of the substrate may be used to form connections to a host printed circuit board; in other embodiments a pin grid array may be used instead. A plurality of decoupling capacitors 520 (e.g., surface mount power supply decoupling capacitors for the electronic integrated circuit 110) may be arranged on the bottom surface of the main substrate 125. Heaters 505 may be used to control the temperature of the photonic integrated circuits 115, as discussed in further detail below.

Figure 6:
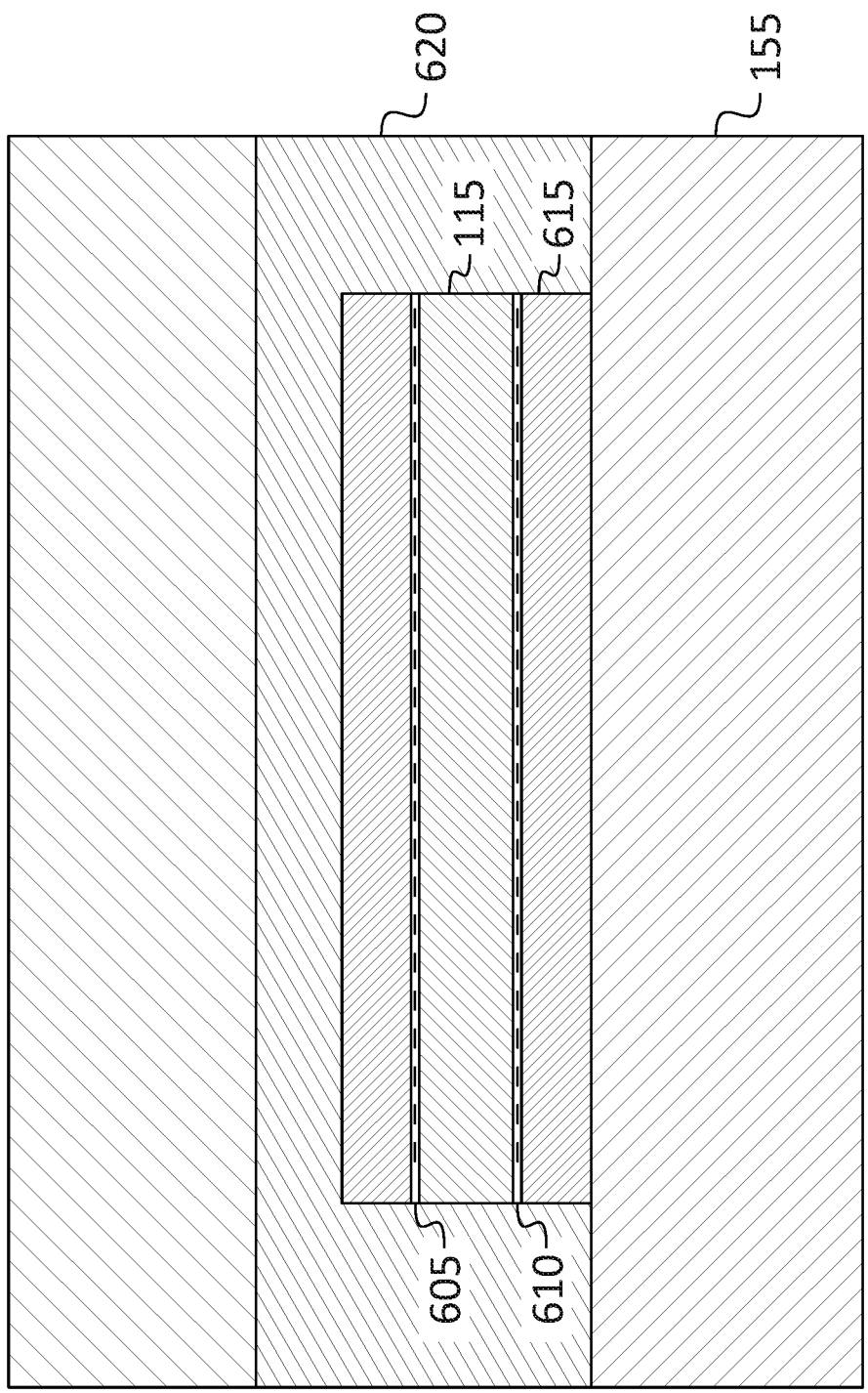
FIG. 6 is a cross-sectional view of a portion of a module, according to an embodiment of the present invention.

Referring to FIG. 6, in some embodiments, the temperature of a photonic integrated circuit 115 may be controlled using one or more flex sensors 605 on one side of the photonic integrated circuit (labelled "Si"), and one or more flex heaters 610 on the other side. A layer of insulating material 615 (e.g., FR4) may be provided between the sandwich (the sandwich including the flex sensor 605, the photonic integrated circuit 115, and the flex heater 610) and the heat sink 155, so that the heater may be capable of maintaining a temperature difference between the heat sink and the photonic integrated circuit 115. The sandwich may be potted in an encapsulation material 620. Such a system may be used when the photonic integrated circuit is sufficiently temperature sensitive that coarser temperature control (e.g., controlling the temperature of the heat sink using a fan) is not sufficient. In some embodiments, temperature control may be provided using instead one or more temperature sensors and one or more heaters that are integral with the photonic integrated circuit (e.g., the temperature sensor and heater are silicon devices fabricated directly on or in the photonic integrated circuit, and form a part of the photonic integrated circuit). In other embodiments, the temperature sensor may be a discrete component mounted on the flex circuit.

Figure 7A:
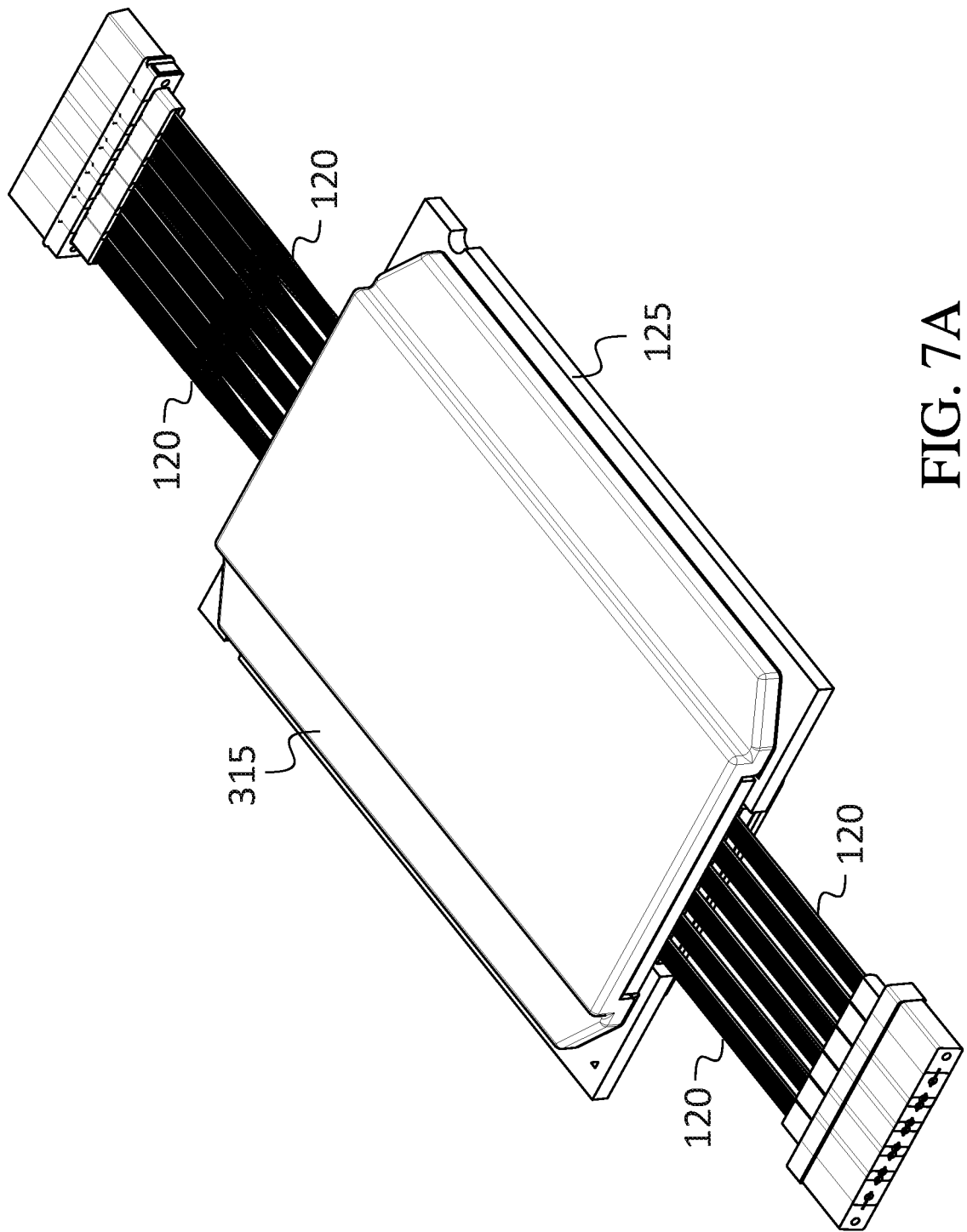
FIG. 7A is a perspective view of a module, according to an embodiment of the present invention.
Figure 7B:
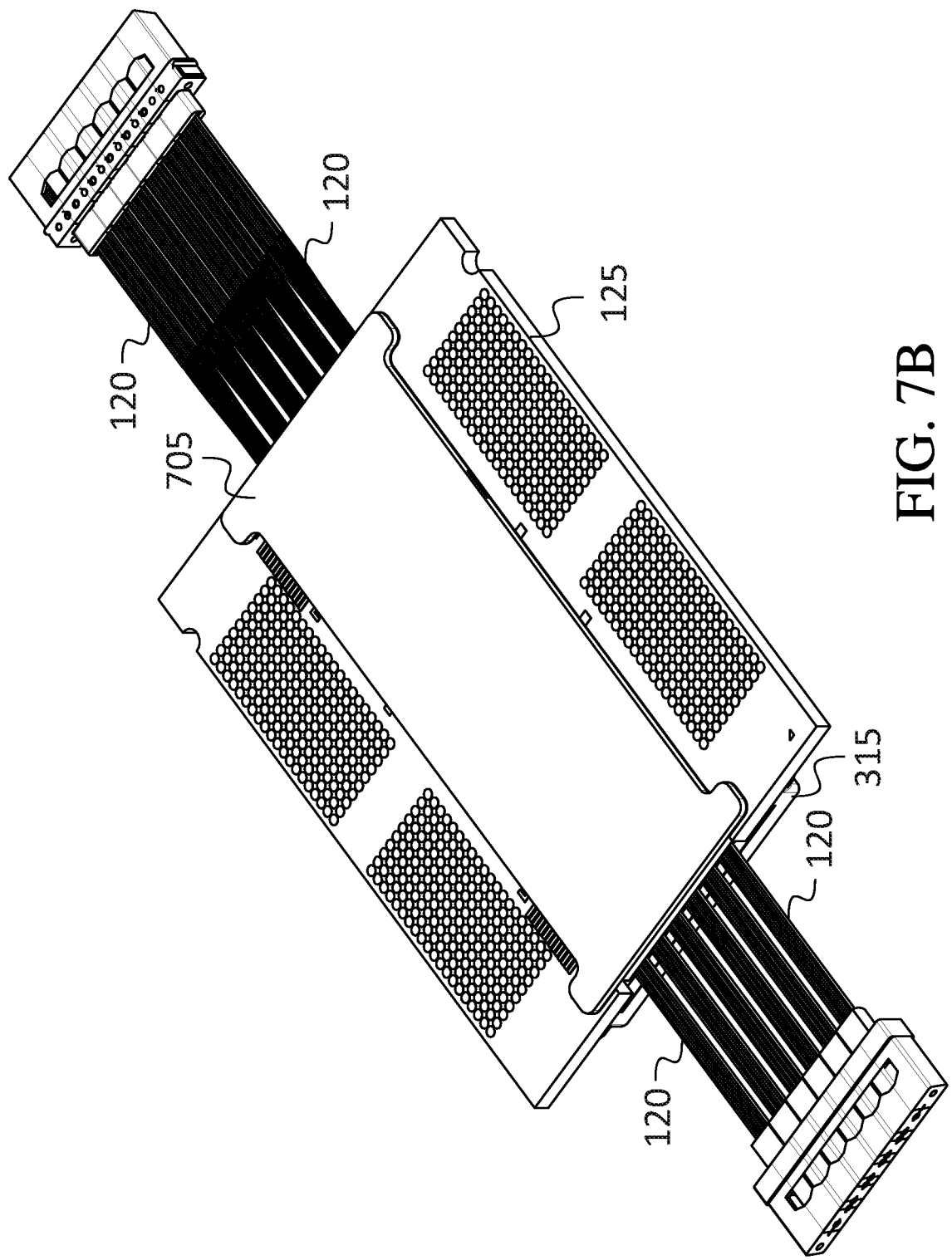
FIG. 7B is a perspective view of a module, according to an embodiment of the present invention.

Referring to FIGS. 7A and 7B, in one embodiment, the metal cover 315, or "metal lid" is secured to one surface (e.g., the upper surface) of the main substrate 125 (FIG. 7A), and a "bottom cover" 705 is secured to the opposite (bottom) surface of the substrate (FIG. 7B).

Figure 8:
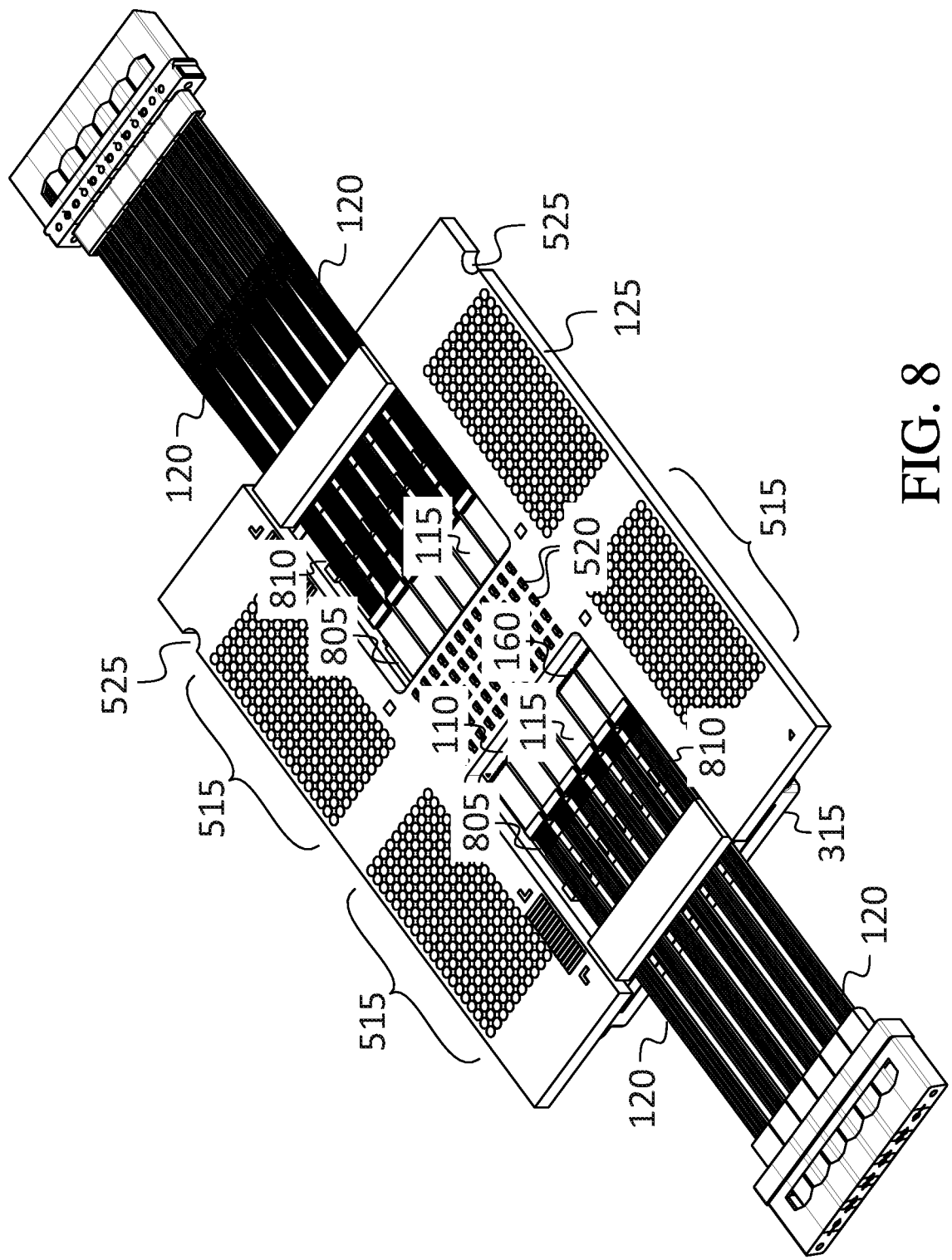
FIG. 8 is a perspective view of a portion of a module, according to an embodiment of the present invention.
Figure 13B:
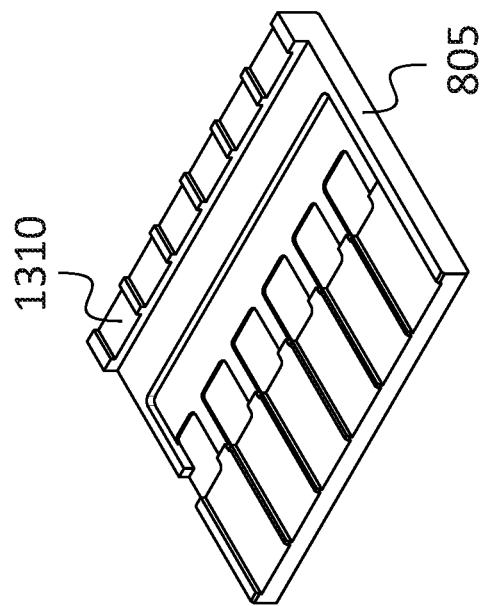
FIG. 13B is a perspective view of a subcarrier, according to an embodiment of the present invention.

Referring to FIG. 8 (showing the module with the bottom cover removed), a plurality of photonic integrated circuits 115 are mounted in a carrier (or "subcarrier") 805 (illustrated in further detail in FIG. 13B), on each side of the electronic integrated circuit 110. The photonic integrated circuits 115 on one side of the electronic integrated circuit 110 may include input photonic integrated circuits 115 (e.g., photonic integrated circuits configured to convert optical data to electrical data) and the photonic integrated circuits 115 on the other side (e.g., the opposite side) of the electronic integrated circuit 110 may include output photonic integrated circuits 115 (e.g., photonic integrated circuits configured to convert electrical data to optical data). In other embodiments, the plurality of photonic integrated circuits 115 on one side (or on both sides) of the electronic integrated circuit 110 may include both input photonic integrated circuits 115 and output photonic integrated circuits 115, or some of the photonic integrated circuits 115 may be configured to perform both input and output functions. The fibers are secured to the subcarriers, for further strain relief, at fiber anchoring points 810, at which the fibers cross, and are bonded (e.g., with epoxy) to rails 1310 (FIG. 13B) on the respective subcarriers 805.

Figure 9A:
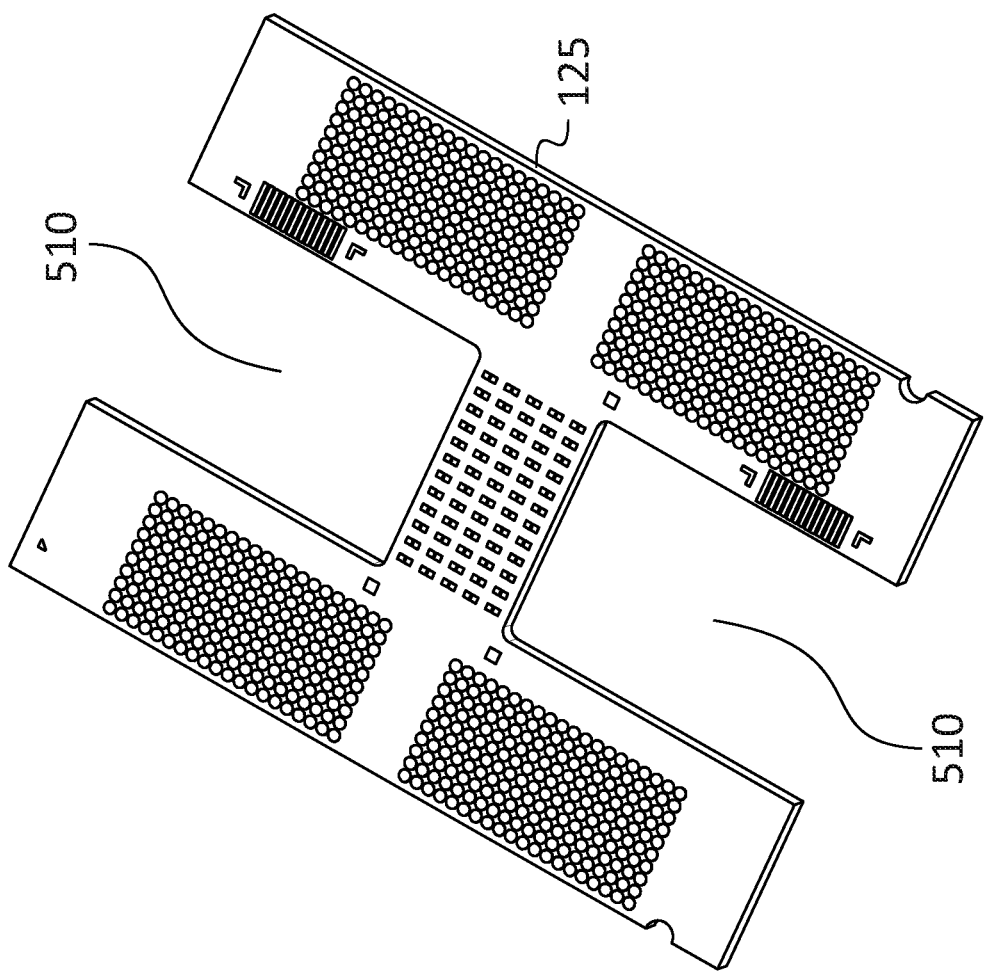
FIG. 9A is a perspective view of a substrate, according to an embodiment of the present invention.
Figure 9B:
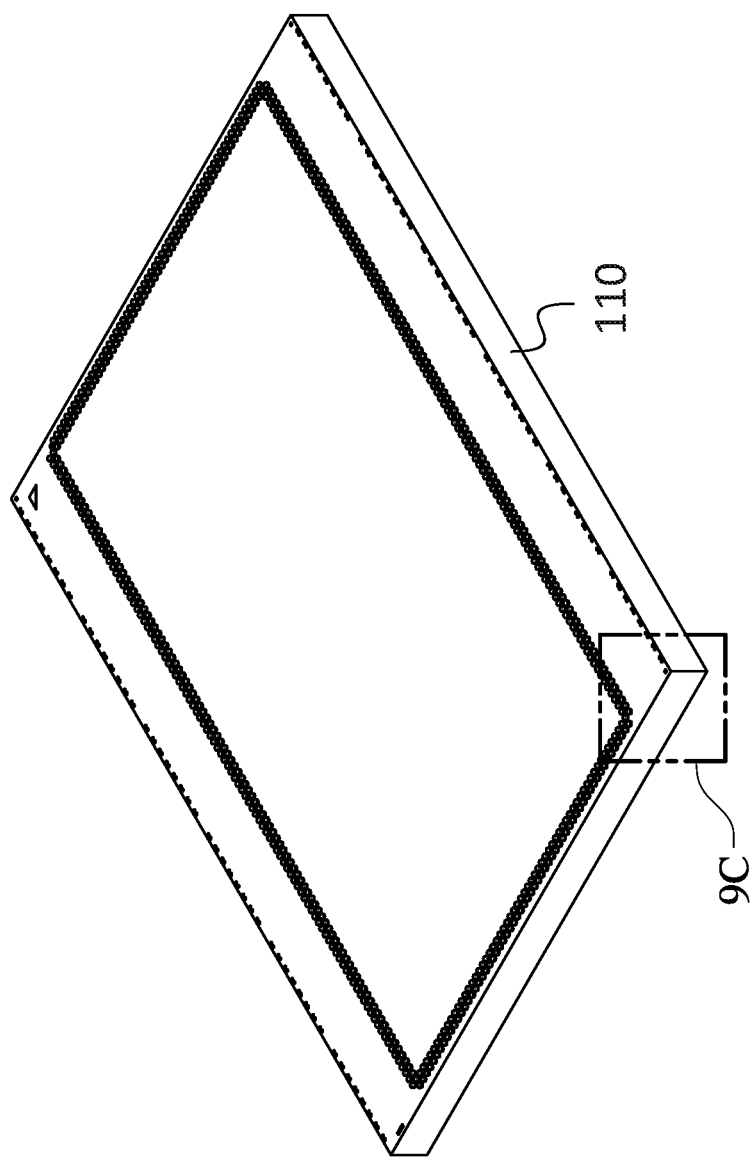
FIG. 9B is a perspective view of an electronic integrated circuit, according to an embodiment of the present invention.
Figure 9C:
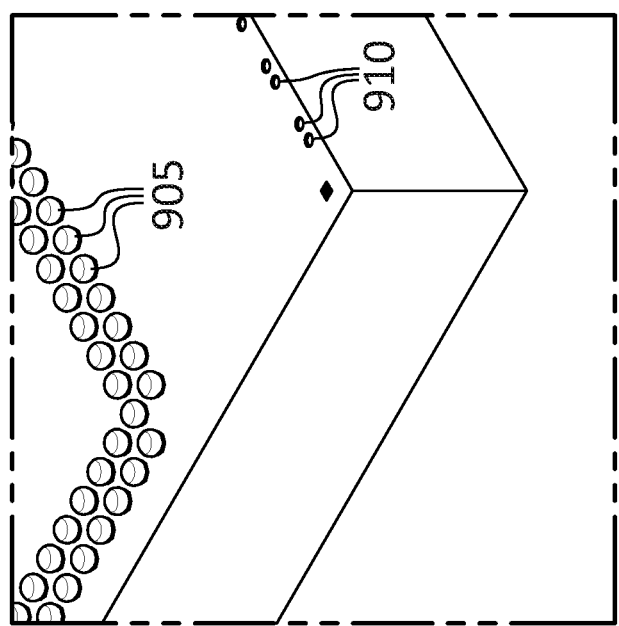
FIG. 9C is an enlarged perspective view of a portion of an electronic integrated circuit, according to an embodiment of the present invention.
Figure 9D:
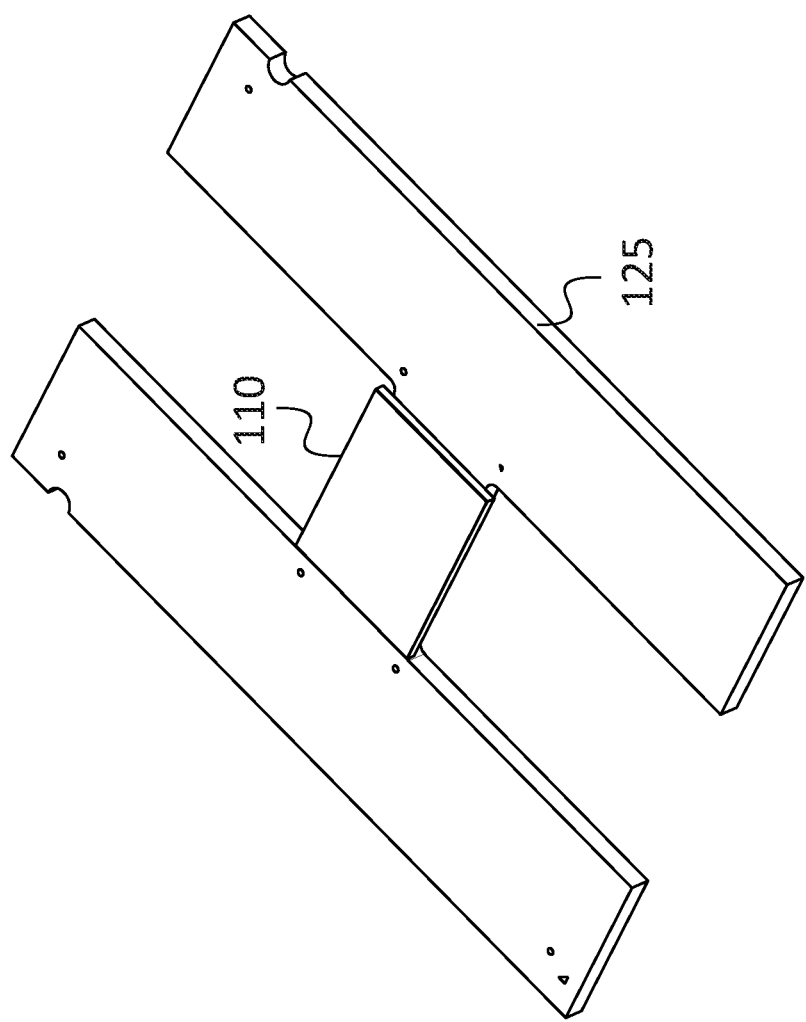
FIG. 9D is a perspective view of an electronic integrated circuit on a substrate, according to an embodiment of the present invention.

FIG. 9A shows the main substrate 125. FIG. 9B is a perspective face-up view of the electronic integrated circuit 110, and FIG. 9C is an enlarged perspective view of a portion, identified by a dashed rectangle labeled "9C", of FIG. 9B. FIG. 9C shows both flip chip solder bumps 905 (through which the electronic integrated circuit 110 may be connected and secured to the main substrate 125) and wire bond pads 910 (through which the electronic integrated circuit 110 may be connected to the photonic integrated circuits 115). For simplicity, only two rows of solder bumps 905 are shown, other embodiments may have a full or partial 2D array of bumps. During assembly, the electronic integrated circuit may be soldered to the substrate, e.g., using a reflow process. In some embodiments, the electronic integrated circuit 110 is connected to the substrate by another method (e.g., using copper pillars, thermocompression stud bumps, a land grid array or a pin grid array instead of solder bumps). If the method employed to connect the electronic integrated circuit 110 to the main substrate 125 does not include soldering the electronic integrated circuit 110 to the main substrate 125, the electronic integrated circuit 110 may be clamped to the main substrate 125 by the metal cover 315. FIG. 9D shows the subassembly formed by securing the electronic integrated circuit 110 to the main substrate 125. The portions of the bottom surface of the electronic integrated circuit 110 that have the wire bond pads 910 (e.g., areas of the bottom surface along two opposite edges of the electronic integrated circuit 110) may overhang the main substrate 125 (e.g., may overhang two corresponding edges of the main substrate 125) as shown, so that the wire bond pads may be exposed, when viewed from below.

Figure 10A:
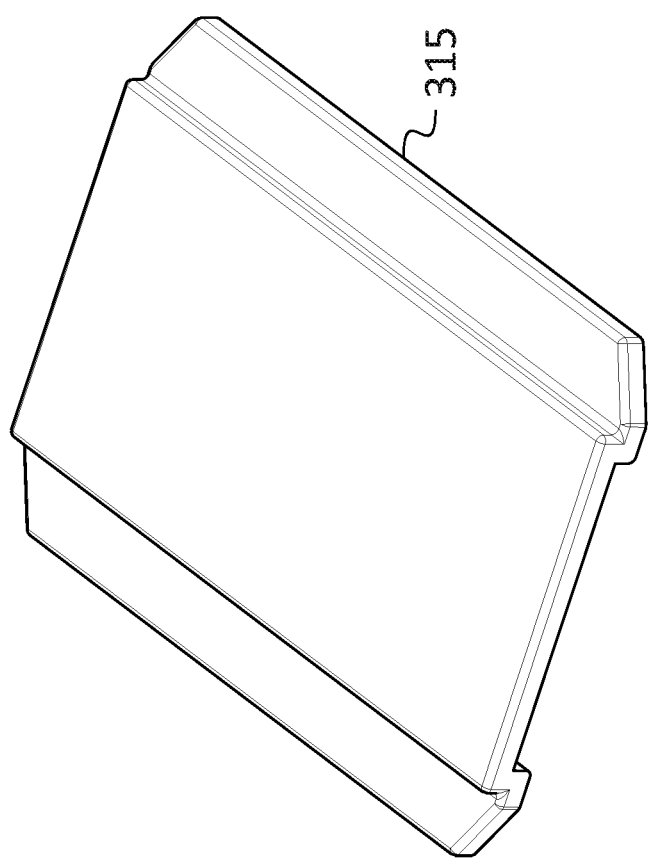
FIG. 10A is a perspective view of a cover, according to an embodiment of the present invention.
Figure 10C:
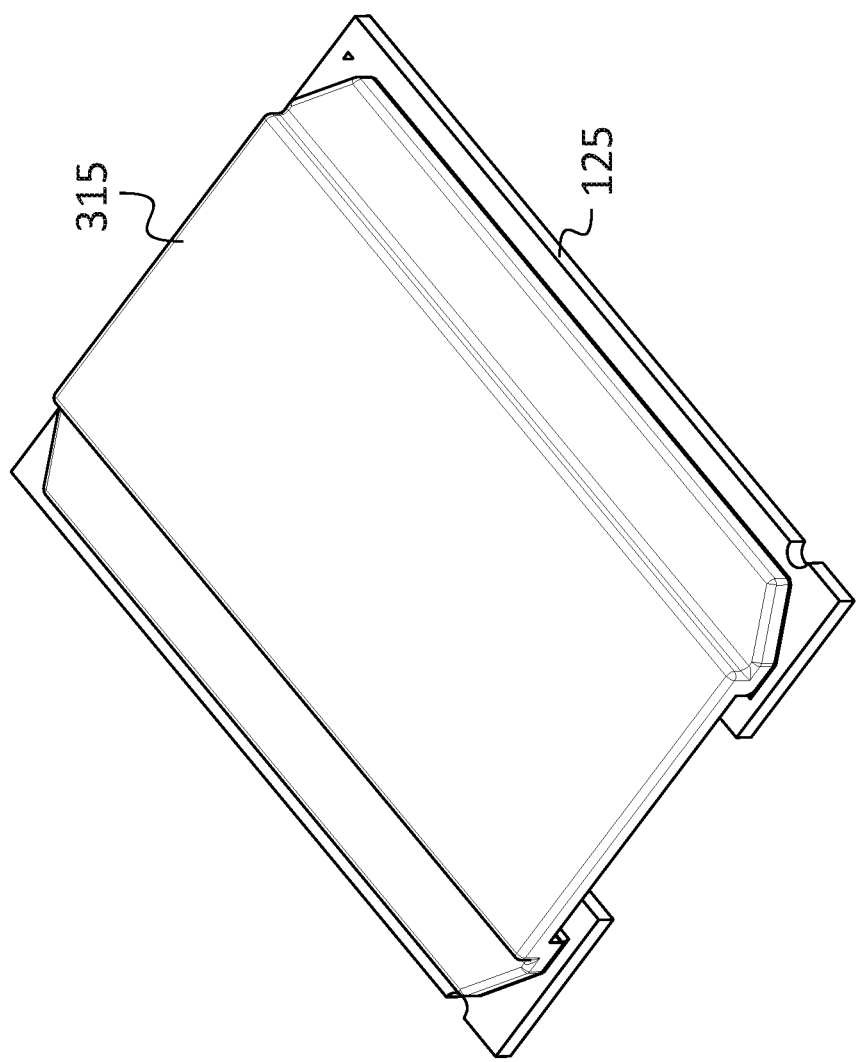
FIG. 10C is a perspective view of a portion of a module, according to an embodiment of the present invention.

FIGS. 10A-10C show the metal cover (or "copper cover", or "copper lid", or "upper cover") in one embodiment. Referring to FIG. 10B, the metal cover 315 may have two walls 1010 and two flanges 1015, and a pedestal 1020 on its bottom surface for making thermal contact with the upper surface of the electronic integrated circuit 110. The pedestal may extend all the way across the metal cover 315, between the two walls 1010 as shown, or it may be smaller (e.g., it may have a rectangular shape of a size similar to that of the top surface of the electronic integrated circuit 110). In some embodiments the pedestal is absent. A thermal interface material (TIM) (e.g., forming a thermal pad 157 as illustrated in FIG. 1B) may be used between the surface of the pedestal (or the bottom surface of the metal cover, if the pedestal is absent) and the upper surface of the electronic integrated circuit. In some embodiments the thermal resistance from the electronic integrated circuit die to the outer surface of the metal cover may be 0.1° C./W, or between 0.1° C./W and 0.01° C./W, or less than 0.01° C./W. As illustrated in FIG. 10C, the two flanges 1015 may be close to the upper surface of the main substrate 125 when the metal cover is installed on the electronic integrated circuit. Gaps between the substrate and respective flanges may be filled with a suitable bonding agent (e.g., epoxy), to secure the metal cover to the substrate.

Figure 11A:
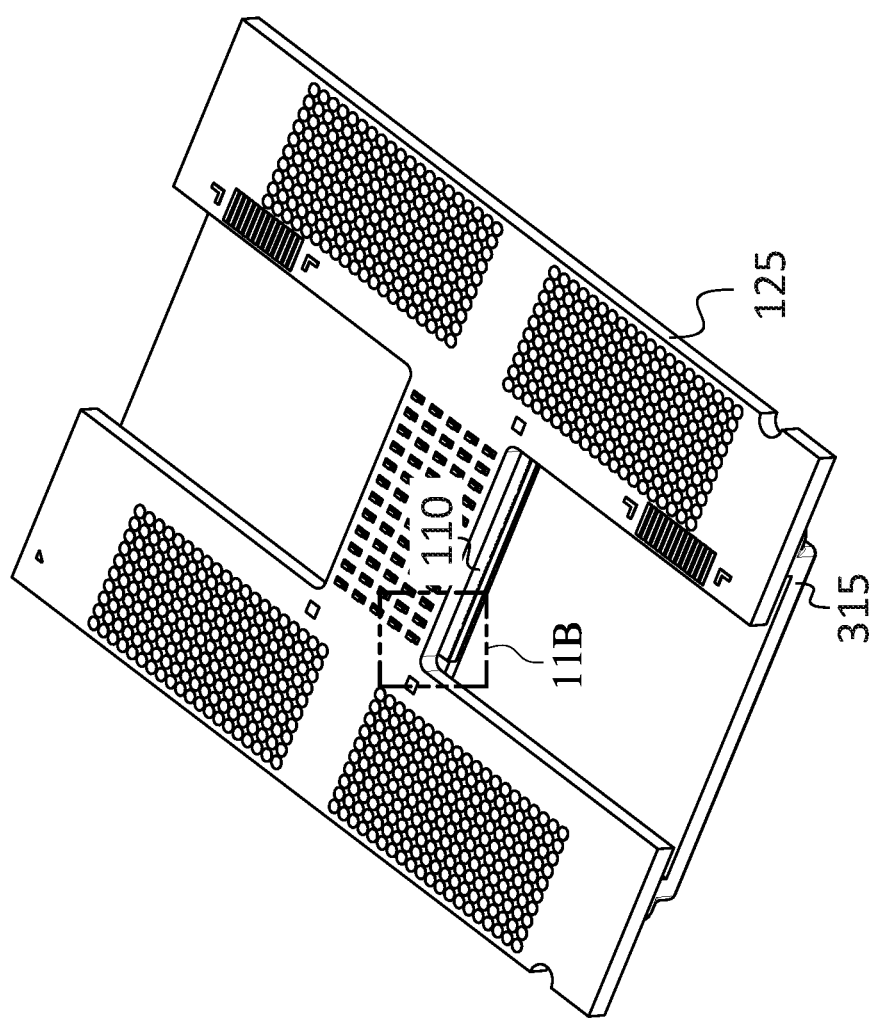
FIG. 11A is a perspective view of a portion of a module, according to an embodiment of the present invention.
Figure 11B:
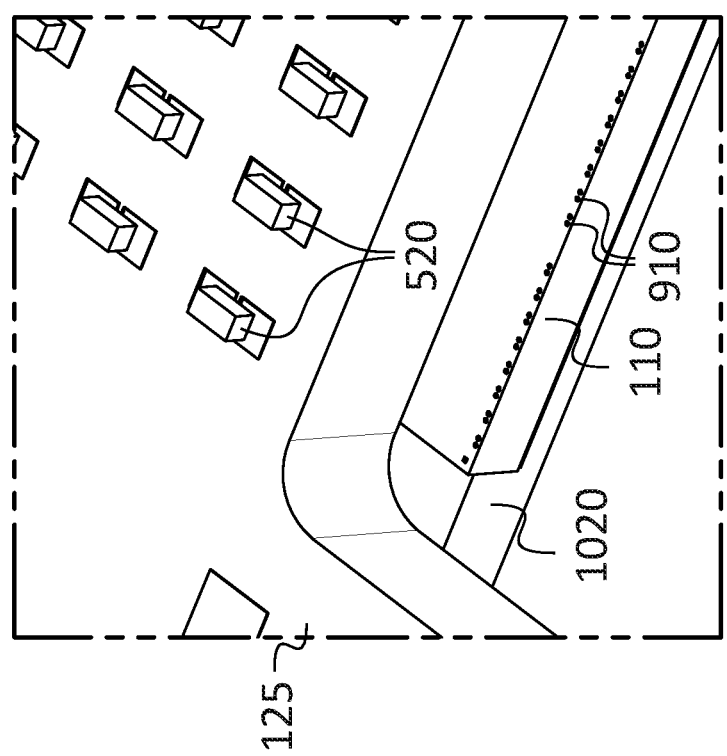
FIG. 11B is an enlarged perspective view of a portion of a module, according to an embodiment of the present invention.
Figure 12B:
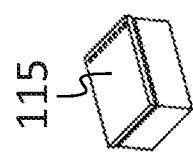
FIG. 12B is a perspective view of a photonic integrated circuit, according to an embodiment of the present invention.
Figure 12C:
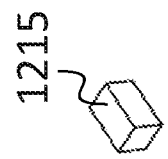
FIG. 12C is a perspective view of a reinforcing block, according to an embodiment of the present invention.
Figure 12A:
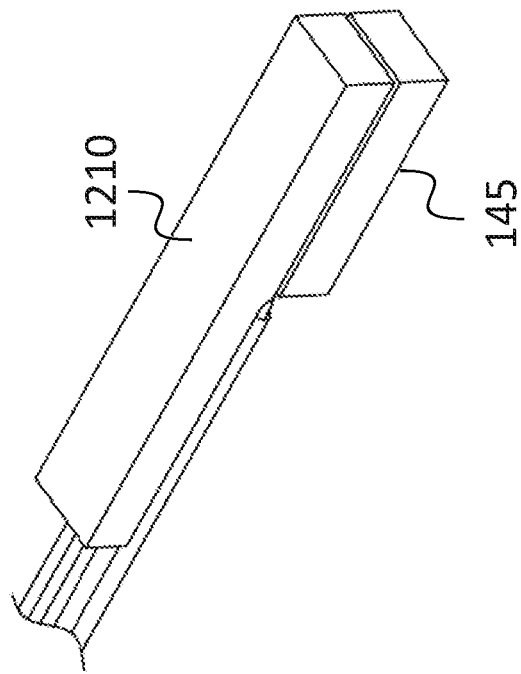
FIG. 12A is a perspective view of a portion of a photonic integrated circuit subassembly, according to an embodiment of the present invention.
Figure 12D:
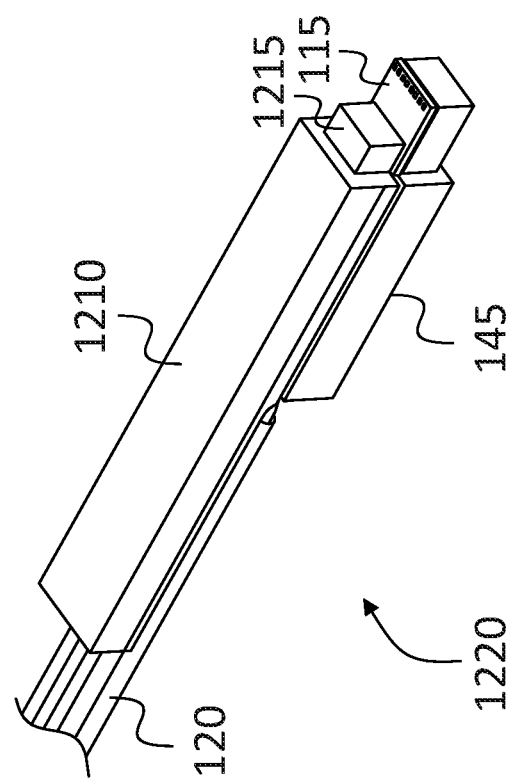
FIG. 12D is a perspective view of a photonic integrated circuit subassembly, according to an embodiment of the present invention.
Figure 13A:
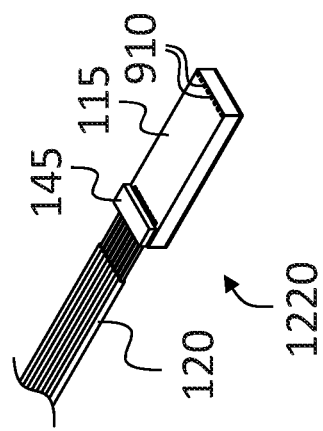
FIG. 13A is a perspective view of a photonic integrated circuit subassembly, according to an embodiment of the present invention.
Figure 13C:
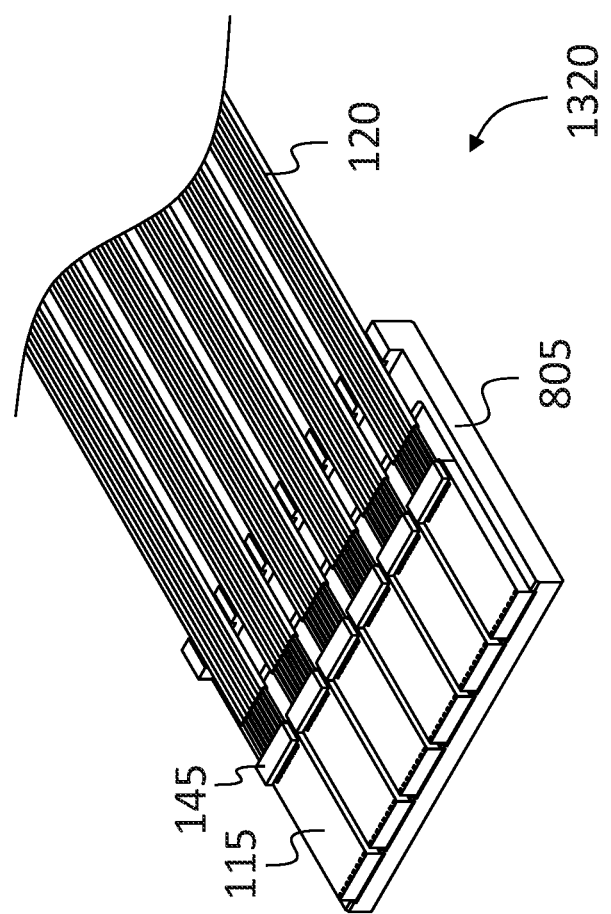
FIG. 13C is a perspective view of a subcarrier with a plurality of photonic integrated circuit subassemblies, according to an embodiment of the present invention.

FIG. 11A is a bottom view of the subassembly including the electronic integrated circuit, the substrate, and the metal cover, showing the overhang mentioned above, and mounting areas for photonics assemblies 1320 (FIG. 13C; described in further detail below). FIG. 11B is an enlarged perspective view of a portion, identified by a dashed rectangle labeled "11B", of FIG. 11A.

In some embodiments, as mentioned above, silicon chips including beam expanders 140 and V-grooves for aligning the fibers may be used with the photonic integrated circuits 115 (instead of integrating these features into the photonic integrated circuits 115 as illustrated, for example, in FIGS. 1A, 2A, 3A, and 8). Referring to FIGS. 12A-D, in other embodiments the V-grooves and the beam expanders 140 may be fabricated in separate parts, referred to as V-groove blocks 1210. Each V-groove block 1210 may be assembled with an array of fibers 120, a glass lid 145, a photonic integrated circuit 115 (FIG. 12B) and a reinforcing block 1215 (FIG. 12C) to form a subassembly 1220, shown in FIG. 12D, and referred to herein as a "PIC subassembly" 1220. The assembly procedure for fabricating a PIC subassembly may include actively aligning the set of fibers (e.g., the set of five fibers) to corresponding optical apertures (e.g., optical input and/or output apertures) of the photonic integrated circuit, and securing together the fibers, the V-groove block 1210, the glass lid 145, and the reinforcing block 1215, e.g., with epoxy. Each PIC subassembly 1220 may be a testable subassembly and may be tested before being incorporated into a module.

Referring to FIG. 13A, in another embodiment a PIC subassembly 1220 includes an array of fibers 120, a photonic integrated circuit 115, and a glass lid 145. Such a PIC subassembly 1220 may perform similar functions to those of the PIC subassembly 1220 illustrated in FIG. 12D. The photonic integrated circuit 115 of FIG. 13A may include an integral V-groove array and an integral array of beam expanders 140, as well as other optical and/or electrical functions. For example, the photonic integrated circuit 115 of FIG. 13A may convert optical signals to electrical signals (e.g., using photodetectors) or it may convert electrical signals to optical signals (e.g., by receiving unmodulated light on a plurality of input fibers, and modulating the light with the electrical signals, using an array of modulators, to generate modulated light transmitted on a plurality of output fibers).

A subcarrier (or "carrier" or "sub carrier") 805 (FIG. 13B) may be used to secure together a plurality of PIC subassemblies 1220 (e.g., six PIC subassemblies 1220), forming assemblies referred to herein as "photonics assemblies" 1320 (FIG. 13C). The subcarrier 805 may be composed of a material having a suitably low coefficient of thermal expansion and suitable thermal conductivity, e.g., copper tungsten, or a plastic or other polymer. The carrier material may have a thermal conductivity of, e.g., 160 W/m/K, for an embodiment without heaters. If heaters are included, the thermal conductivity may be reduced, e.g., to 0.25 W/m/K, to improve the heating efficiency. Materials with intermediate values of thermal conductivity may be selected to provide the optimum combination of heating efficiency and thermal time constant. The PIC subassemblies 1220 may be secured to the subcarrier 805 with a suitable bonding agent (e.g., epoxy).

Figure 14A:
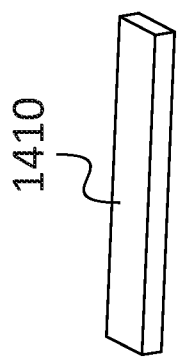
FIG. 14A is a perspective view of a strain relief, according to an embodiment of the present invention.
Figure 14B:
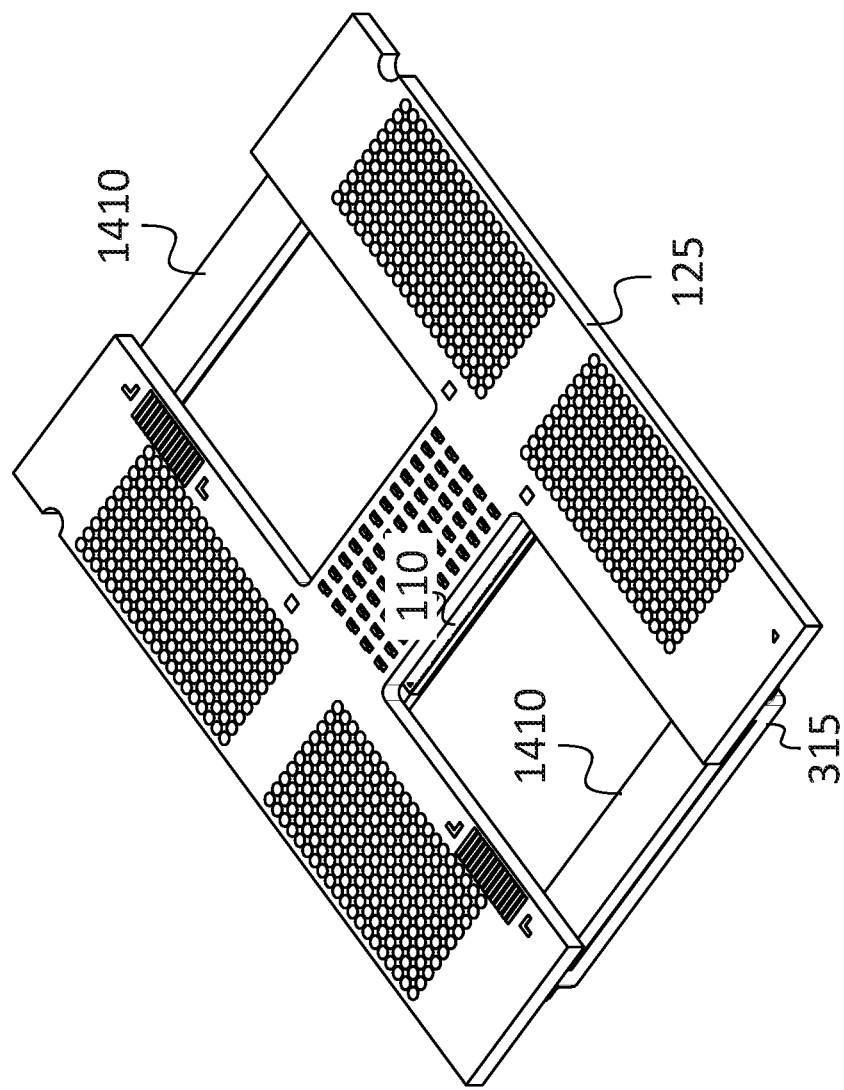
FIG. 14B is a perspective view of a portion of a module, according to an embodiment of the present invention.
Figure 15A:
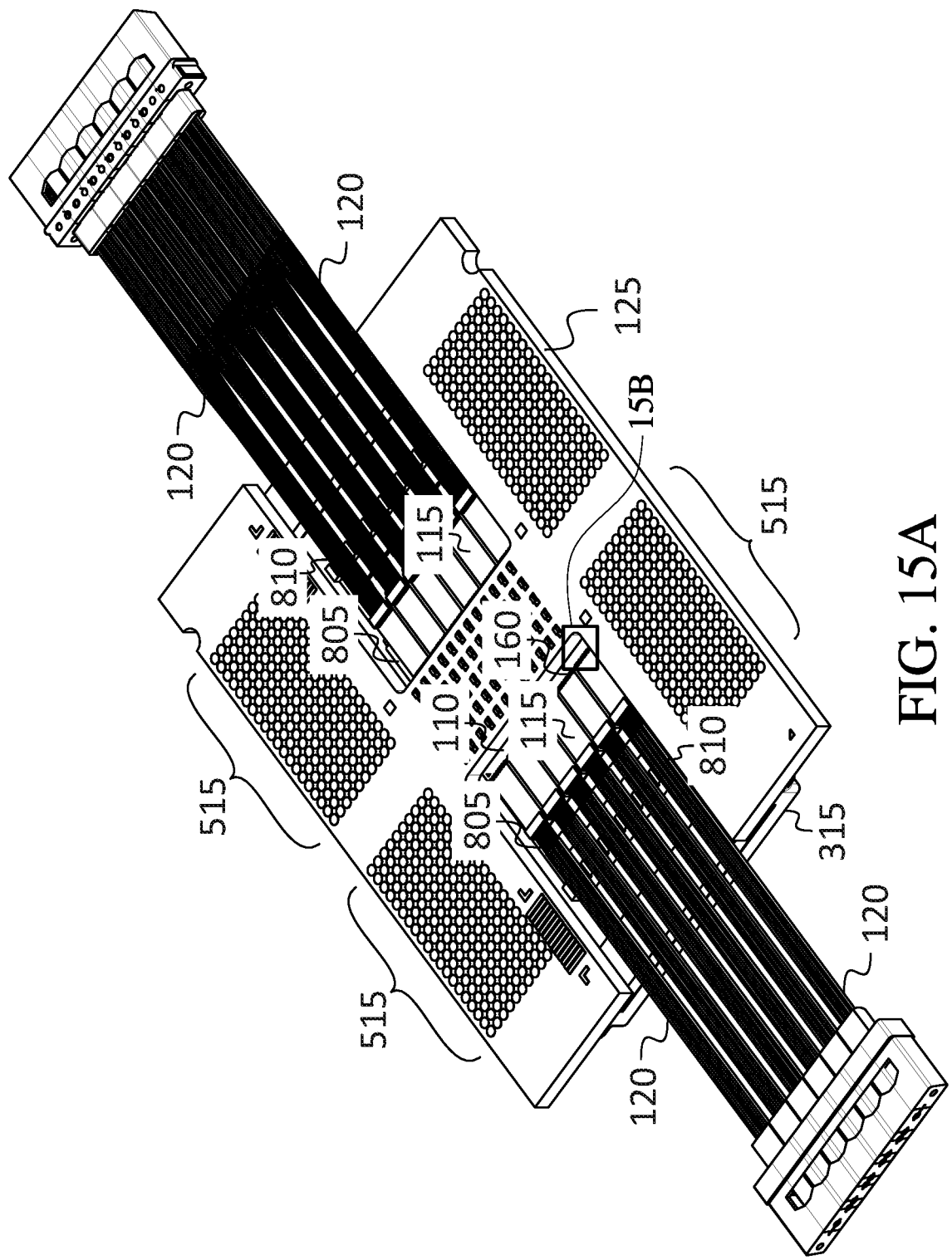
FIG. 15A is a perspective view of a portion of a module, according to an embodiment of the present invention.
Figure 15B:
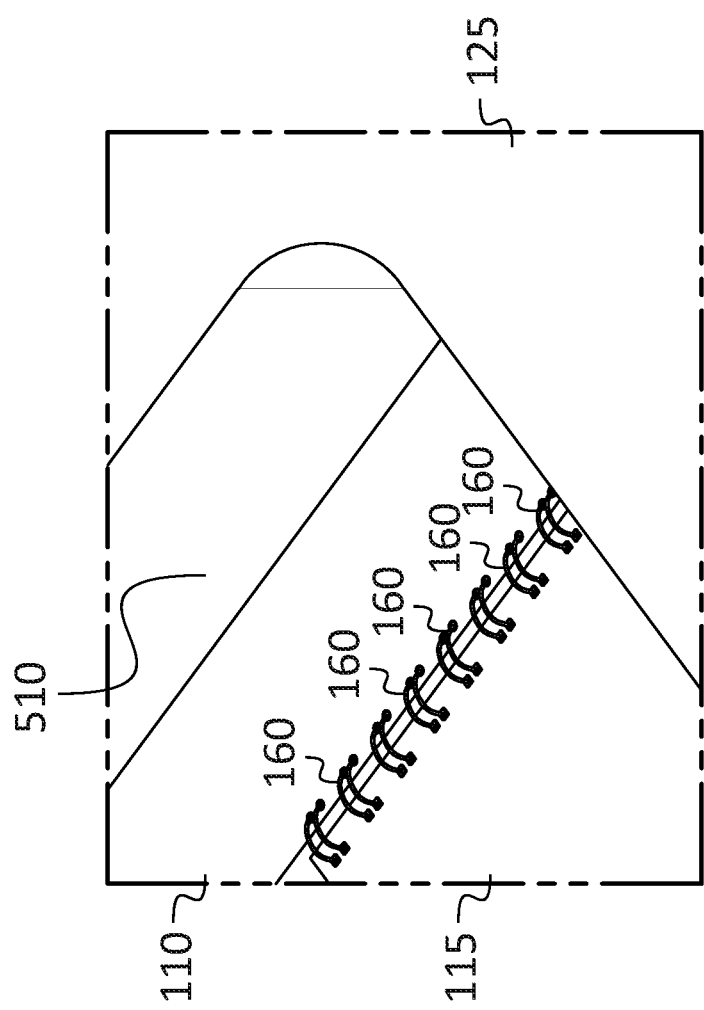
FIG. 15B is an enlarged perspective view of a portion of a module, according to an embodiment of the present invention.

Referring to FIGS. 14A and 14B, an upper strain relief 1410 (FIG. 14A) may be bonded into each of two locations in the metal cover 315 to form the subassembly shown in FIG. 14B, which includes the main substrate 125, the electronic integrated circuit 110, the metal cover 315, and two upper strain reliefs 1410 as shown. In some embodiments the surface of each upper strain relief 1410 that abuts against the fibers 120 is flat as shown; in other embodiments it may have a shallow channel for each array of fibers 120 to constrain the array of fibers 120 laterally. A suitable bonding agent, e.g., a silicone elastomer, may be used. Two photonics assemblies 1320 may then be bonded (e.g., using a suitable epoxy) to respective mounting areas, on the bottom surface of the metal cover 315, and the photonic integrated circuits 115 may be wire bonded to the electronic integrated circuit 110 to form the subassembly illustrated in FIG. 15A. FIG. 15B is an enlarged perspective view of a portion, identified by a dashed rectangle labeled "15B", of FIG. 15A. FIG. 15B shows the set of wire bonds 160 connecting one of the photonic integrated circuits 115 to the electronic integrated circuit 110, and it shows the access (for forming the wire bonds 160) that the cutout 510 in the main substrate 125 provides to the region in which the wire bonds 160 are formed.

Figure 16A:
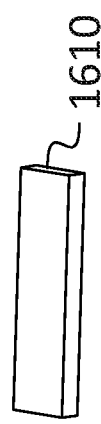
FIG. 16A is a perspective view of a strain relief, according to an embodiment of the present invention.
Figure 16B:
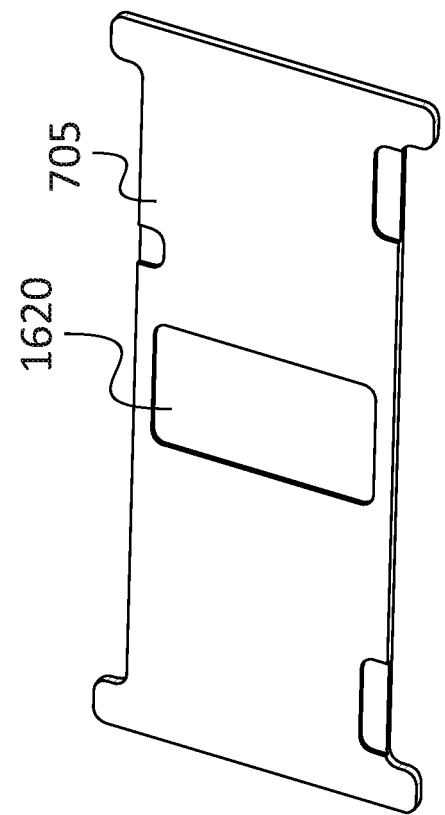
FIG. 16B is a perspective view of a cover, according to an embodiment of the present invention.

FIG. 16A shows a lower strain relief 1610. Like the upper strain reliefs 1410, the surface of the lower strain relief 1610 that abuts against the fibers 120 is flat as shown; in other embodiments it may have a shallow channel for each array of fibers 120. FIG. 16B shows a top perspective view of the bottom cover 705. The top surface of the bottom cover 705 may have a pocket 1620 to provide clearance for the decoupling capacitors 520, or other components such as a flex circuit to provide electrical power to the heaters and sensors.

Figure 16C:
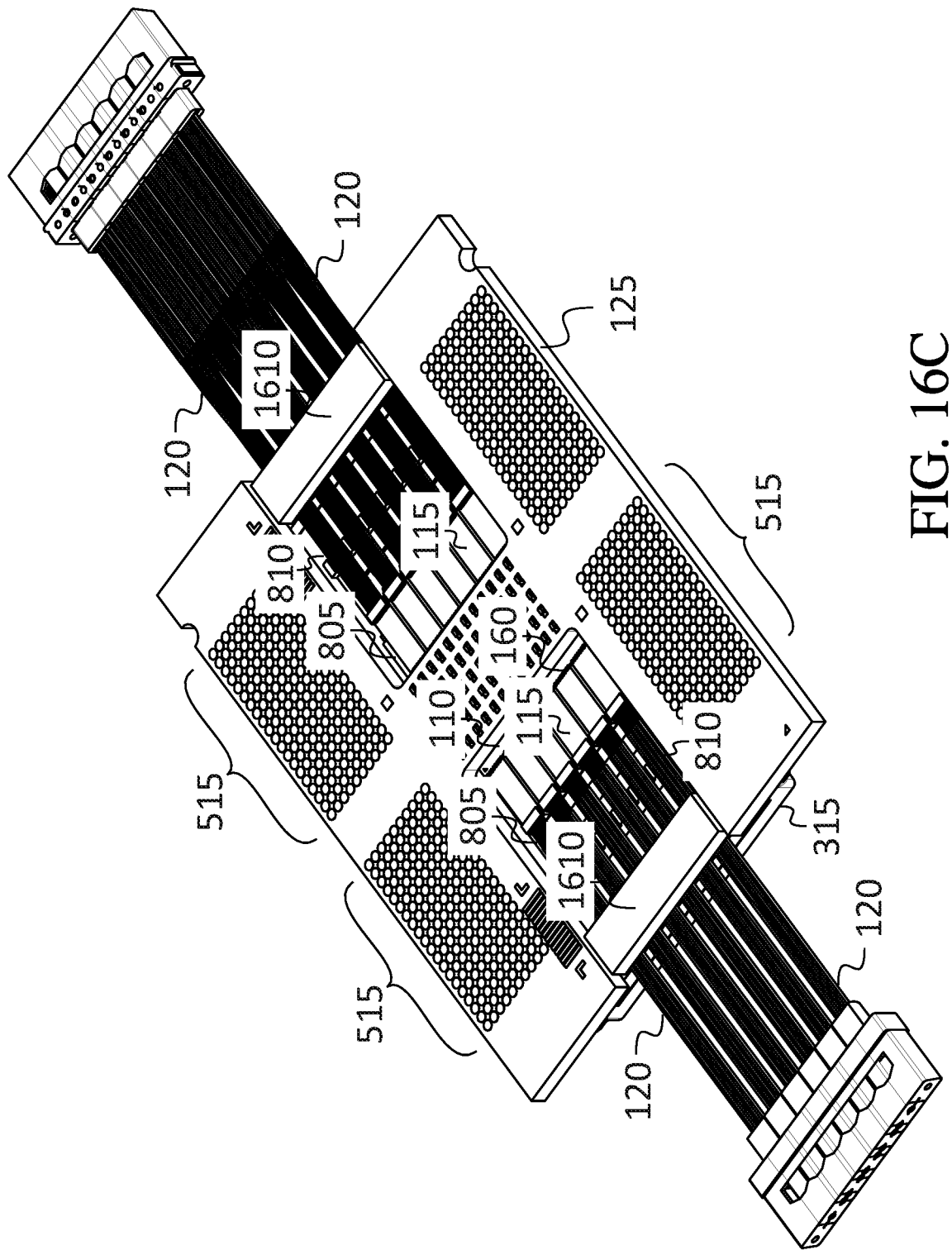
FIG. 16C is a perspective view of a portion of a module, according to an embodiment of the present invention.
Figure 16D:
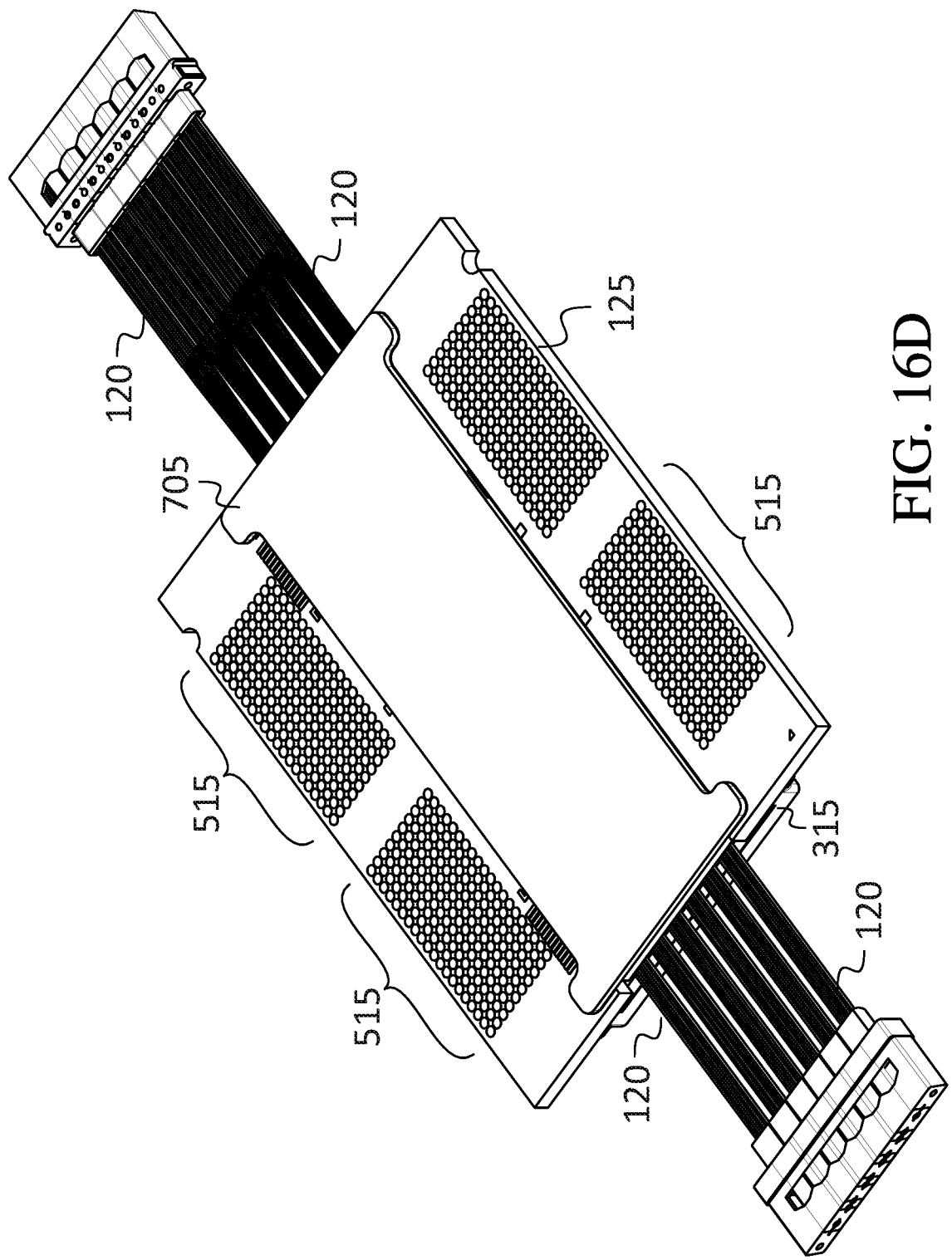
FIG. 16D is a perspective view of a module, according to an embodiment of the present invention.
Figure 17:
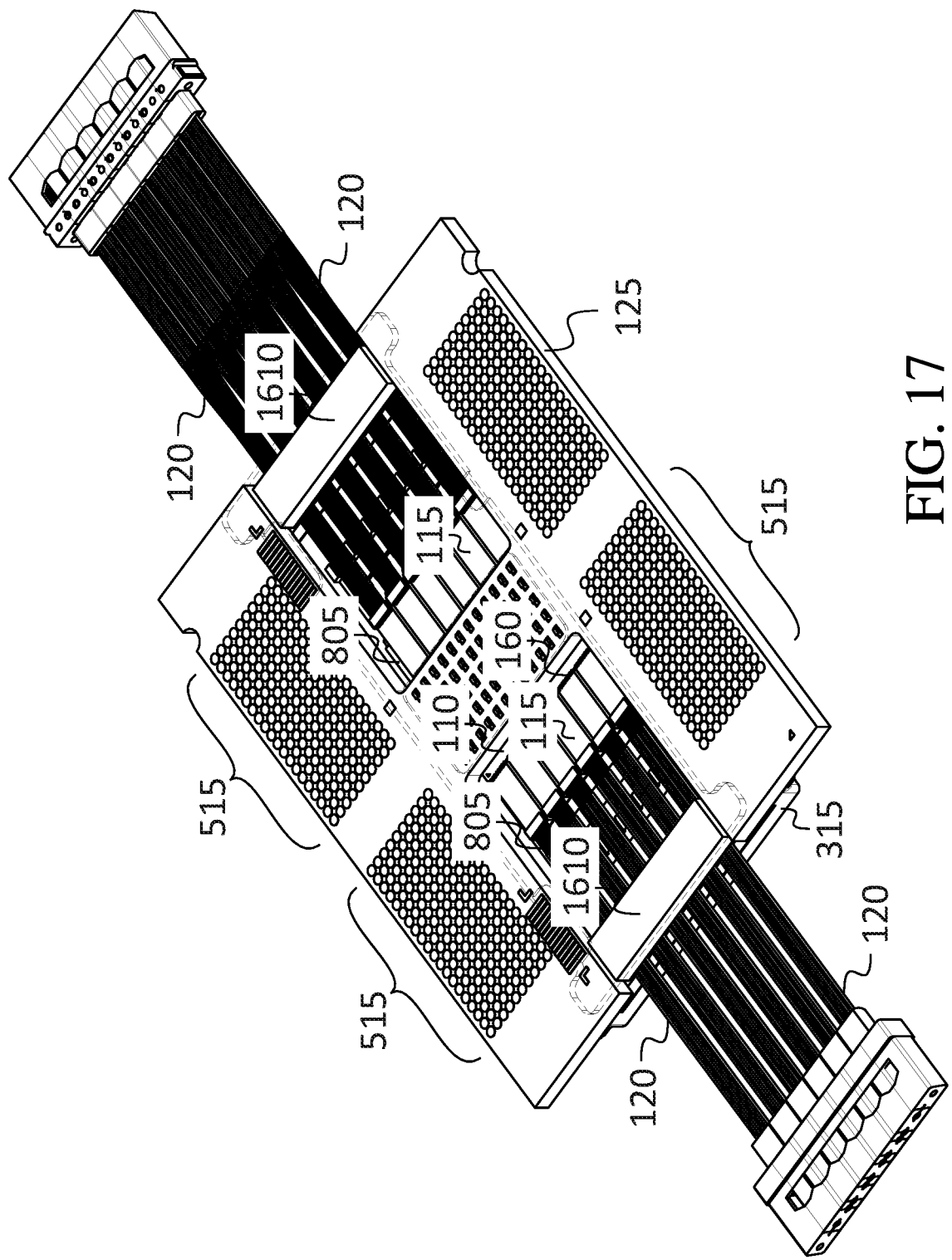
FIG. 17 is a perspective view of a module, according to an embodiment of the present invention.

FIG. 16C shows a subassembly that results from the installation of a lower strain relief 1610 in each of two places; each of these may be bonded to a corresponding upper strain relief, and to the fibers, with a suitable bonding agent, e.g., a silicone elastomer. FIG. 16D shows a completed assembly, after installation of the bottom cover 705, which may be bonded to the two lower strain reliefs, also with a suitable bonding agent, e.g., a silicone elastomer. The installation and bonding of the lower strain reliefs 1610 and of the bottom cover 705 may be performed in one step, using the same bonding agent. The bottom cover 705 may include bosses configured to fit into the cutouts in the substrate to facilitate alignment during this assembly step. FIG. 17 shows a bottom view of the complete module, with the bottom cover illustrated as being transparent, allowing certain interior features of the module to be visible.

Figure 18:
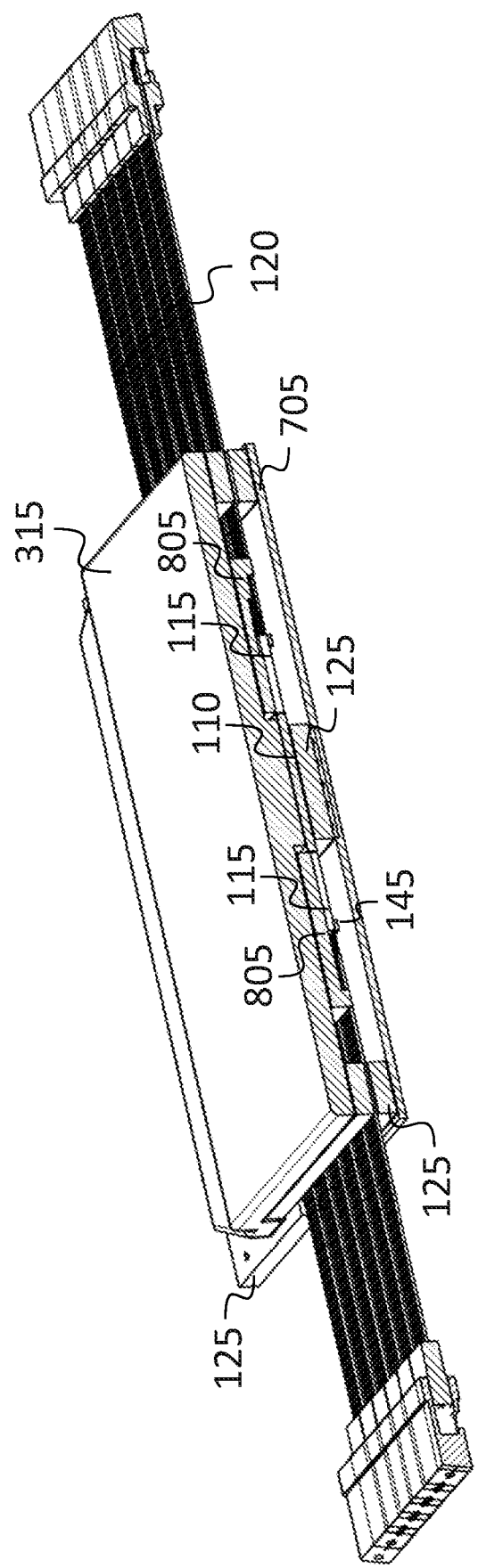
FIG. 18 is a cutaway perspective view of a portion of a module, according to an embodiment of the present invention.
Figure 19:
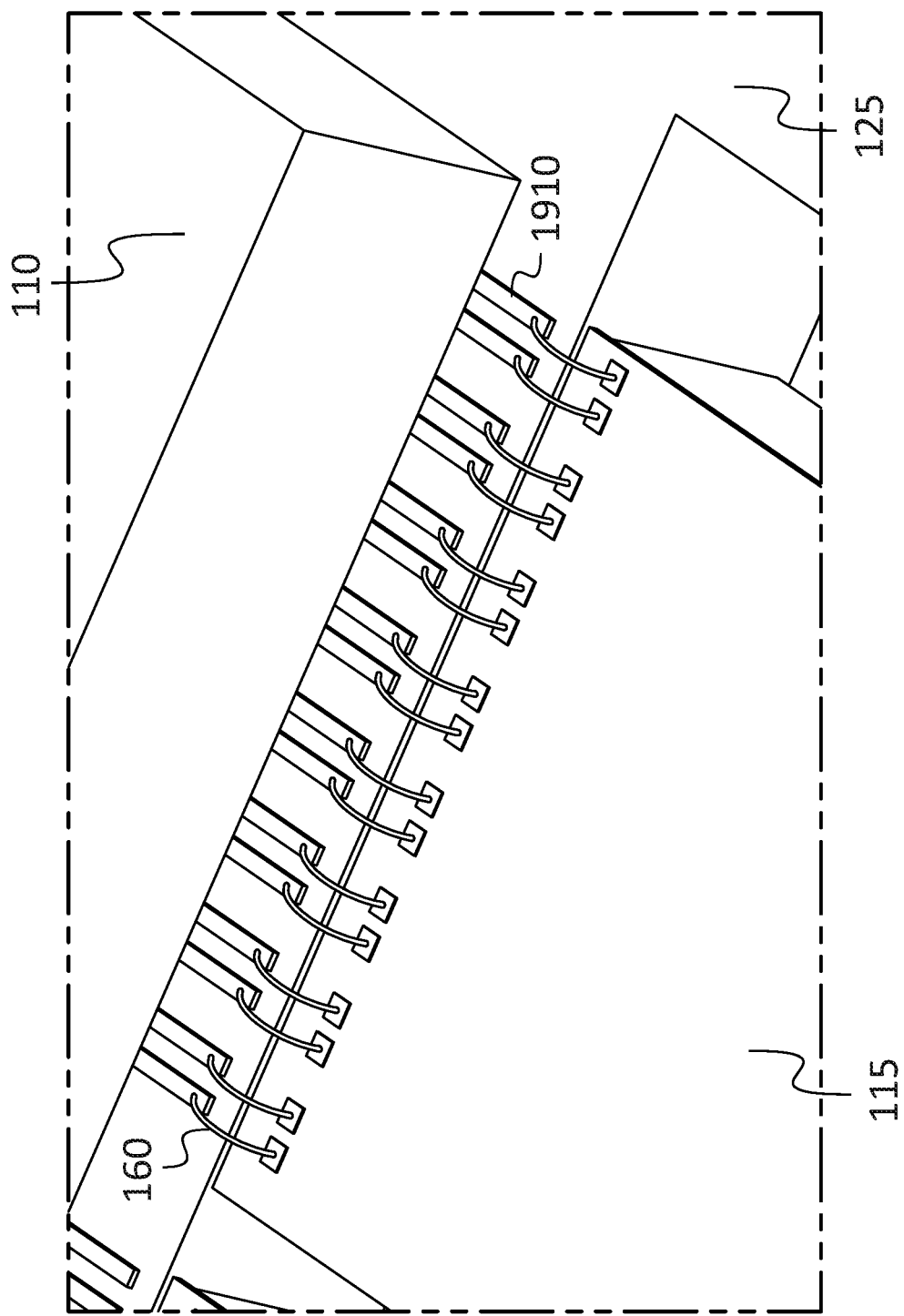
FIG. 19 is an enlarged perspective view of a portion of a module, according to an embodiment of the present invention.

FIG. 18 shows a cutaway perspective view of a complete module including an electronic integrated circuit 110 and having optical data ports, with a cutting plane offset from the center of the module. FIG. 19 shows an embodiment in which the electronic integrated circuit 110 is flip-chip mounted on the main substrate 125 (e.g., using copper pillars), and traces 1910 on the main substrate 125 form connections between high-speed electrical contacts of the electronic integrated circuit 110 and corresponding wire bond pads on the main substrate 125. Two pockets are formed in (e.g., milled into) the main substrate 125 for the photonics assemblies 1320, which are then bonded into the pockets. Wire bonds 160 are used to connect the wire bond pads on the photonic integrated circuits 115 to the traces 1910 on the main substrate 125.

Figure 20A:
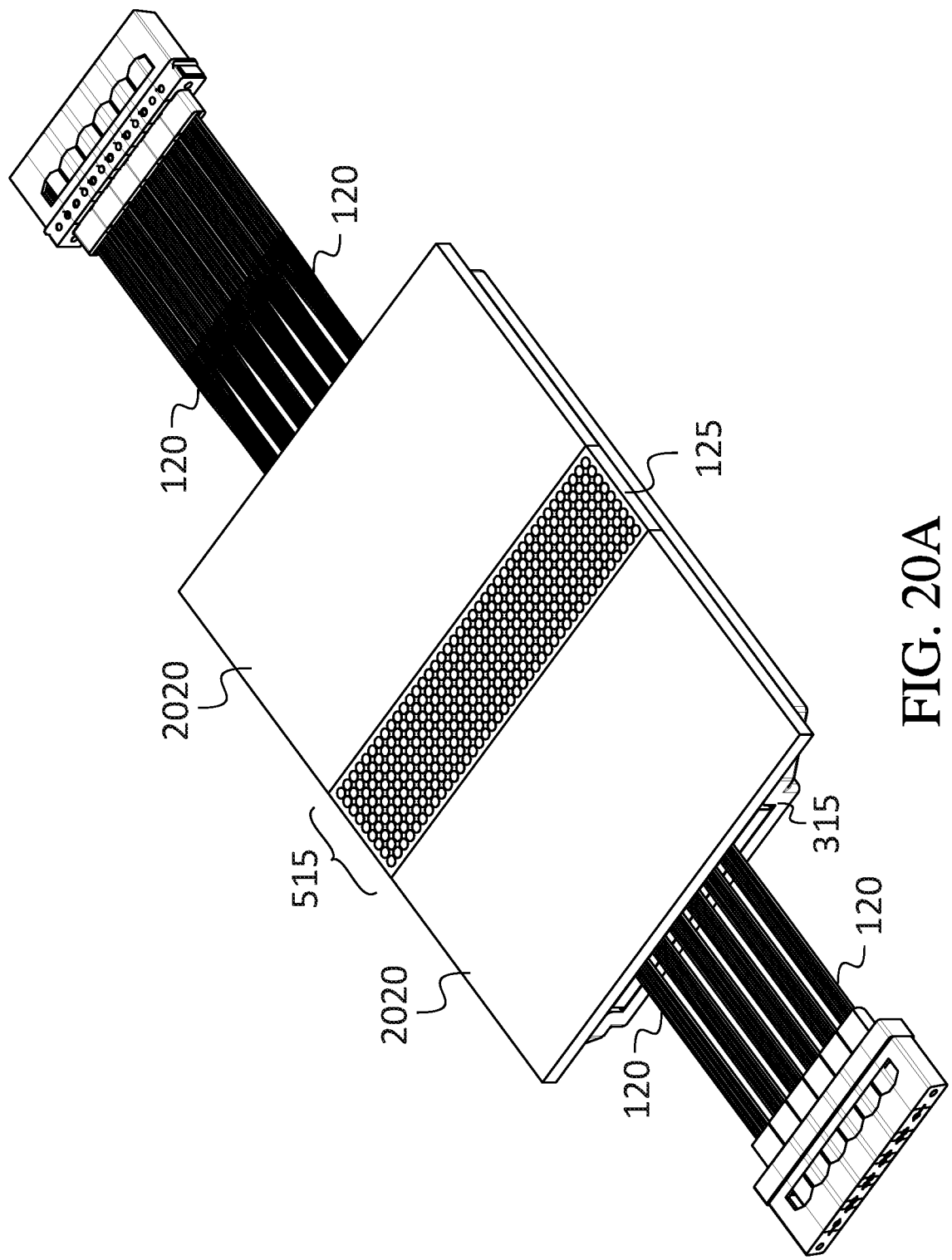
FIG. 20A is a perspective view of a module, according to an embodiment of the present invention.
Figure 20B:
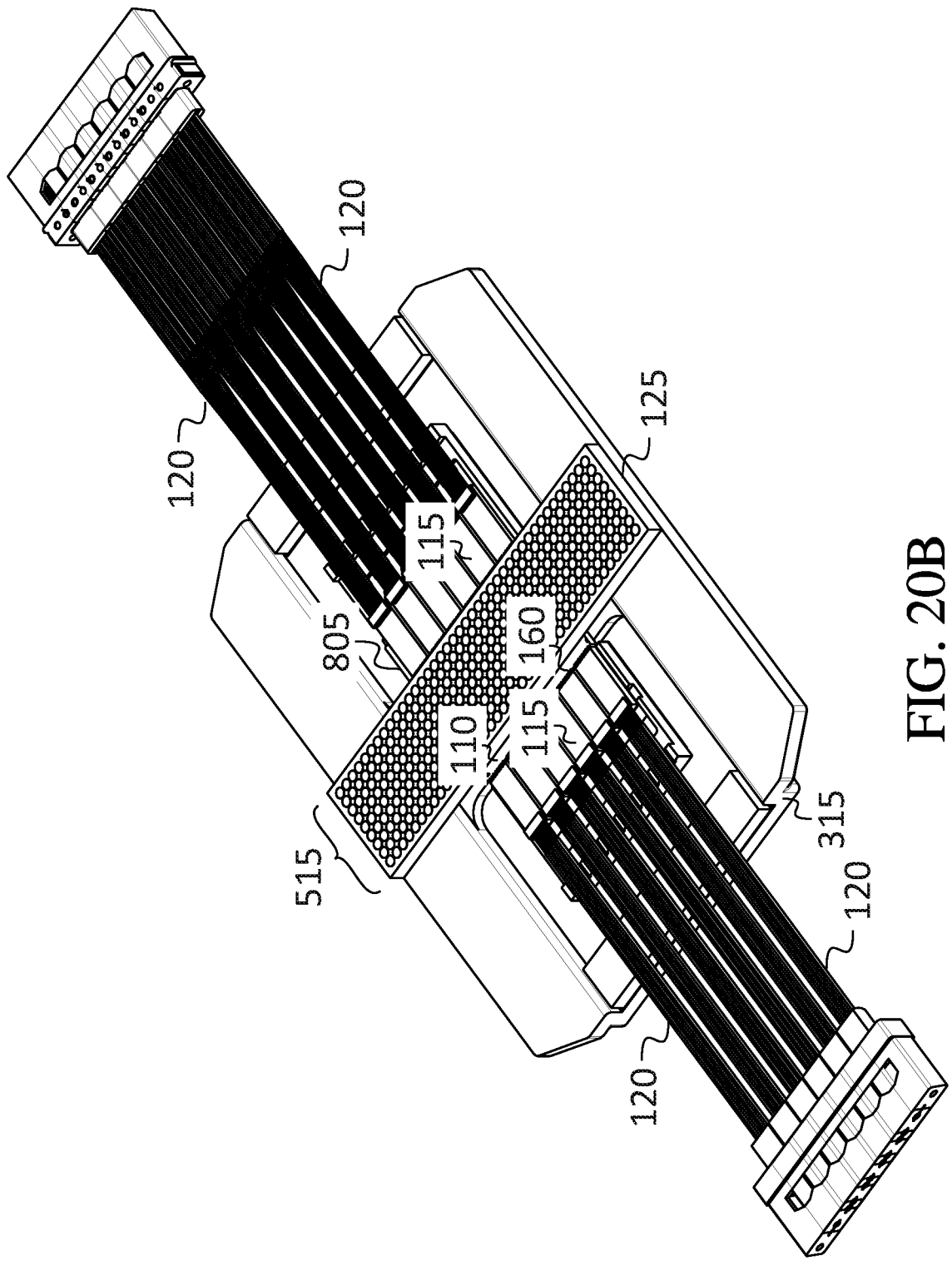
FIG. 20B is a perspective view of a portion of a module, according to an embodiment of the present invention.
Figure 21A:
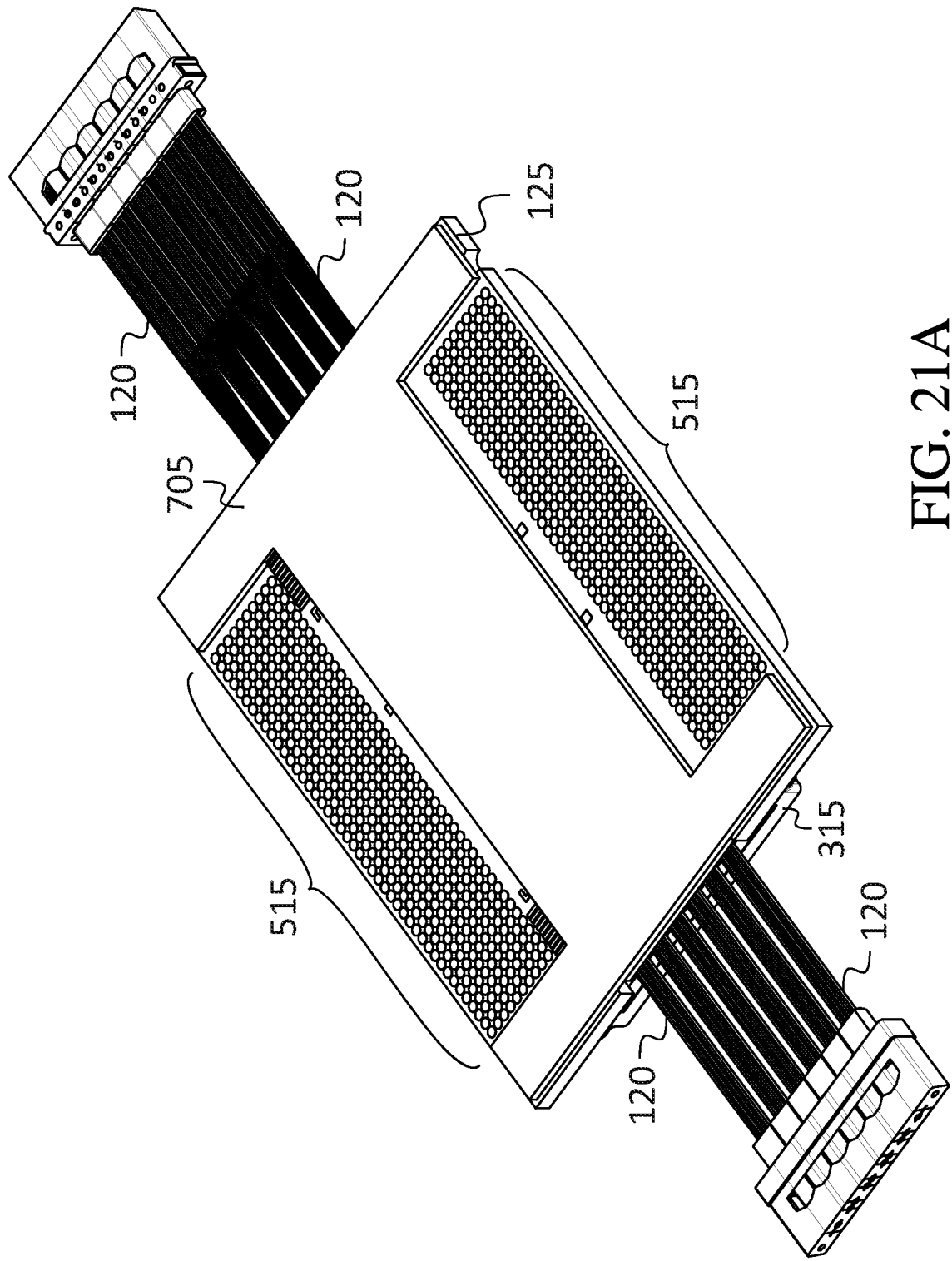
FIG. 21A is a perspective view of a module, according to an embodiment of the present invention.
Figure 21B:
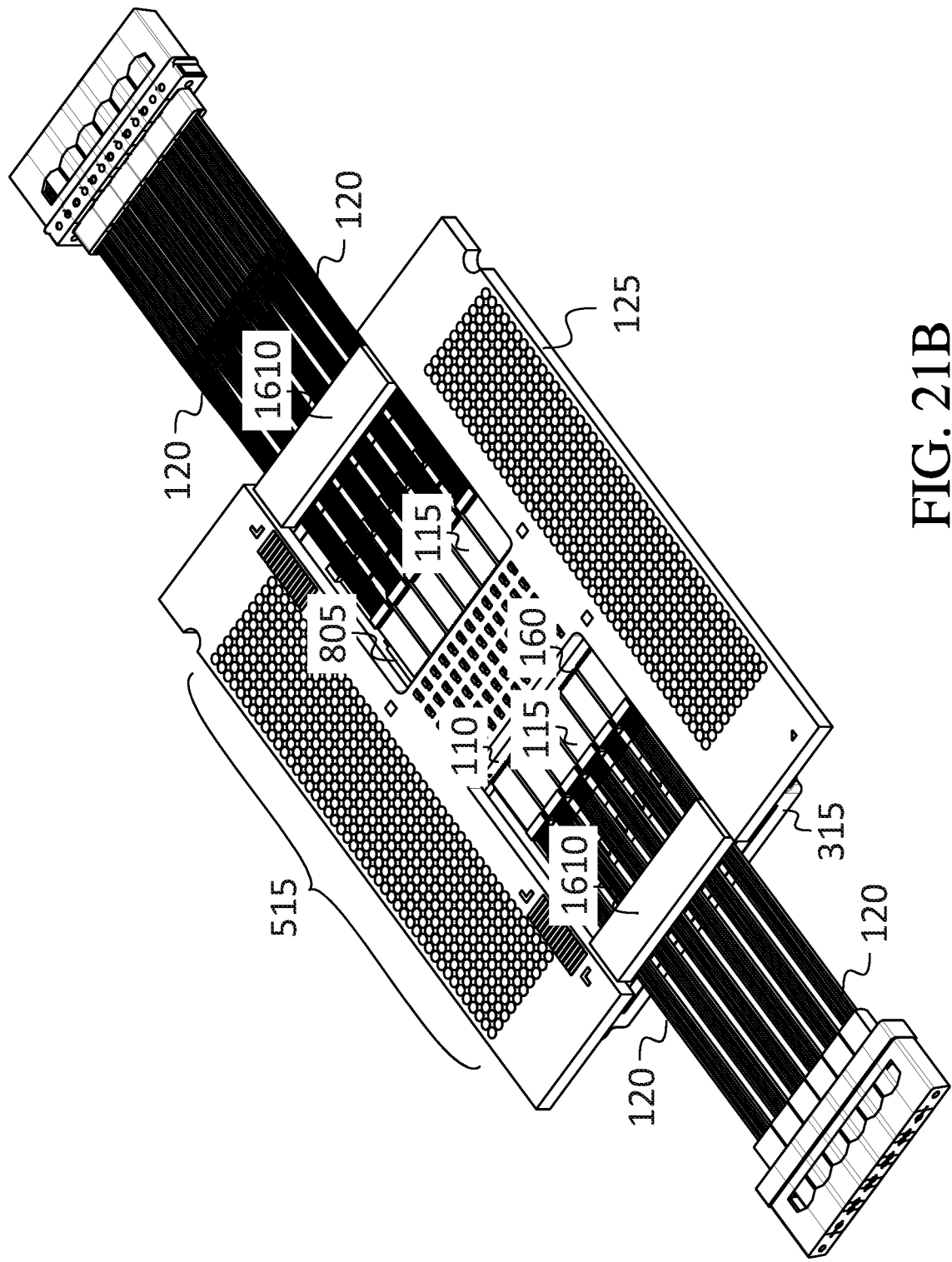
FIG. 21B is a perspective view of a portion of a module, according to an embodiment of the present invention.

In another embodiment, illustrated in FIGS. 20A and 20B, a rectangular main substrate 125 is secured (e.g., soldered) to the electronic integrated circuit 110 and bonded to the metal cover 315. Wire bonds 160 are formed between the wire bond pads on the photonic integrated circuits 115 and the wire bond pads on the electronic integrated circuit 110. A cover (e.g., a two-piece reinforced plastic cover 2020, as shown in FIG. 20A) may then be bonded to the metal cover, along with upper and lower strain reliefs, to seal the module. FIG. 21A shows an embodiment in which each of the main substrate 125 and the bottom cover 705 has the shape of an H, and FIG. 21B shows an interior view of such an embodiment.

Figure 22A:
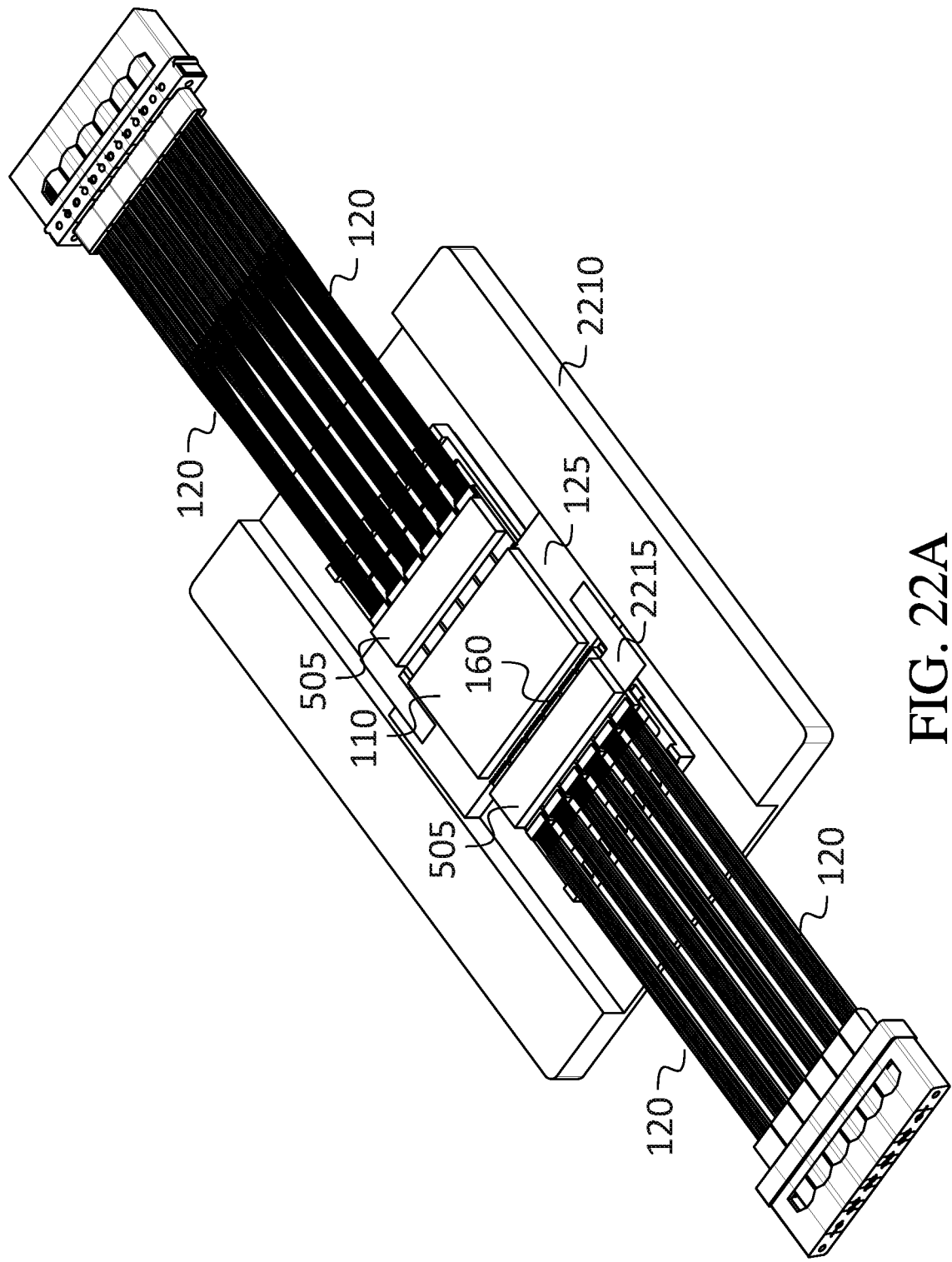
FIG. 22A is a perspective view of a portion of a module, according to an embodiment of the present invention.
Figure 22B:
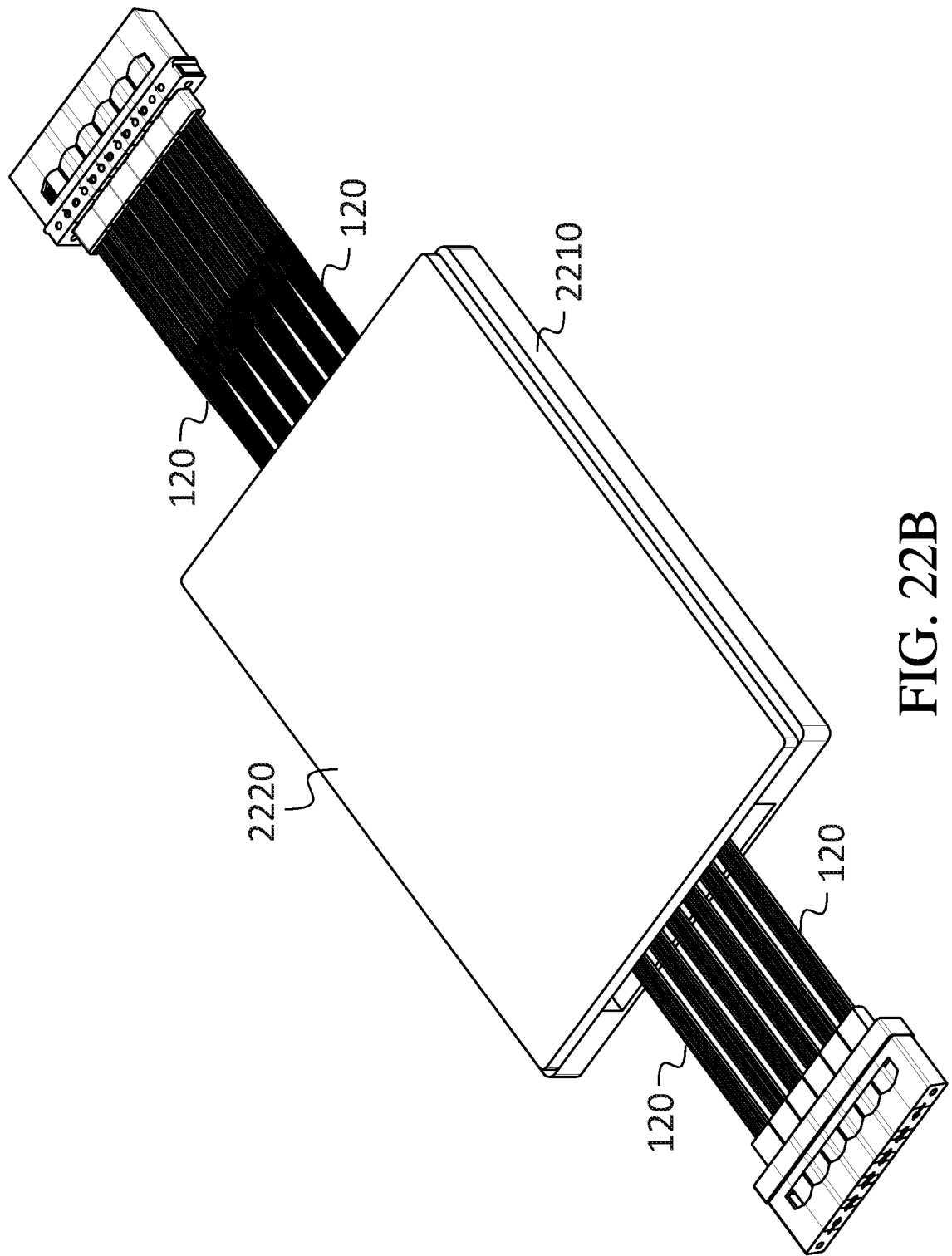
FIG. 22B is a perspective view of a module, according to an embodiment of the present invention.
Figure 22C:
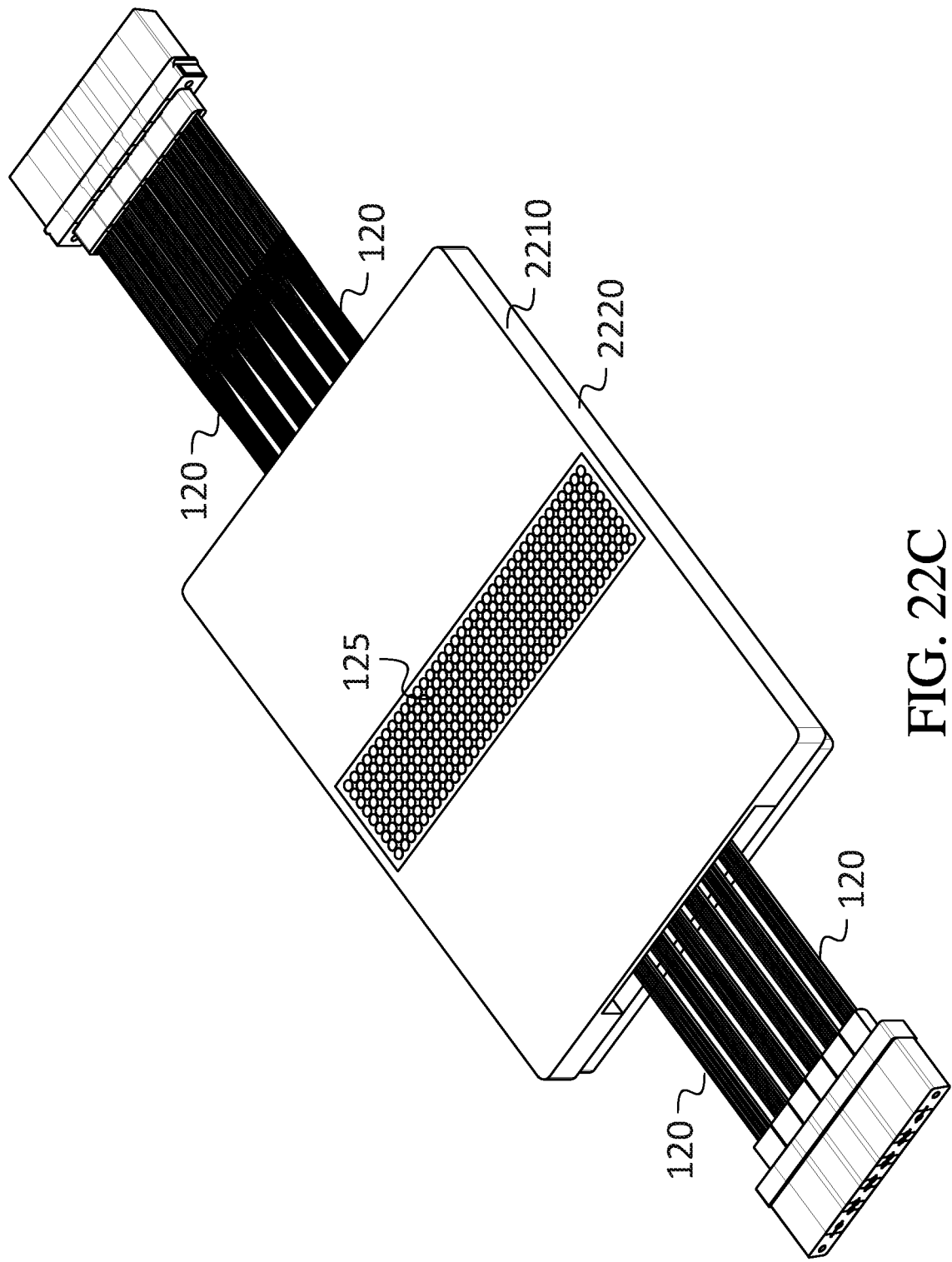
FIG. 22C is a perspective view of a module, according to an embodiment of the present invention.
Figure 22D:
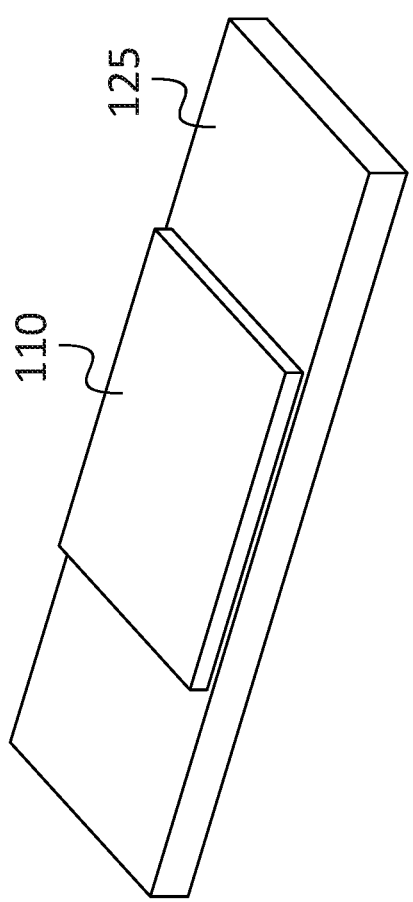
FIG. 22D is a perspective view of an electronic integrated circuit on a substrate, according to an embodiment of the present invention.

In another embodiment, illustrated in FIG. 22A, (in a manner similar to that of the embodiment of FIG. 19) the electronic integrated circuit is flip-chip mounted on the main substrate 125 (e.g., using copper pillars), and traces on the main substrate 125 form connections between high-speed contacts of the electronic integrated circuit 110 and corresponding wire bond pads on the main substrate 125. The main substrate 125 and the photonics assemblies are bonded to the upper surface of a (e.g., molded liquid crystal polymer plastic) bottom cover 2210. Wire bonds 160 are used to connect the wire bond pads on the photonic integrated circuits to the traces on the main substrate 125. In some embodiments the bottom cover 2210 is molded to include the features of subcarriers 805 (e.g., pockets for photonic integrated circuits 115, and anchor points) so that the photonic integrated circuits 115 are bonded directly to the bottom cover and separate subcarriers are not used. Flex circuits 2215 may be employed to carry drive current from the main substrate 125 to the heaters 505. Once otherwise assembled, the subassembly of FIG. 22A may be covered with a flat metal lid 2220 to form the assembly of FIG. 22B. FIG. 22C shows a bottom view of such an embodiment, and FIG. 22D shows a subassembly, including an electronic integrated circuit 110 secured and connected to a main substrate 125, which may be fabricated as part of the fabrication process of such an embodiment.

Figure 23:
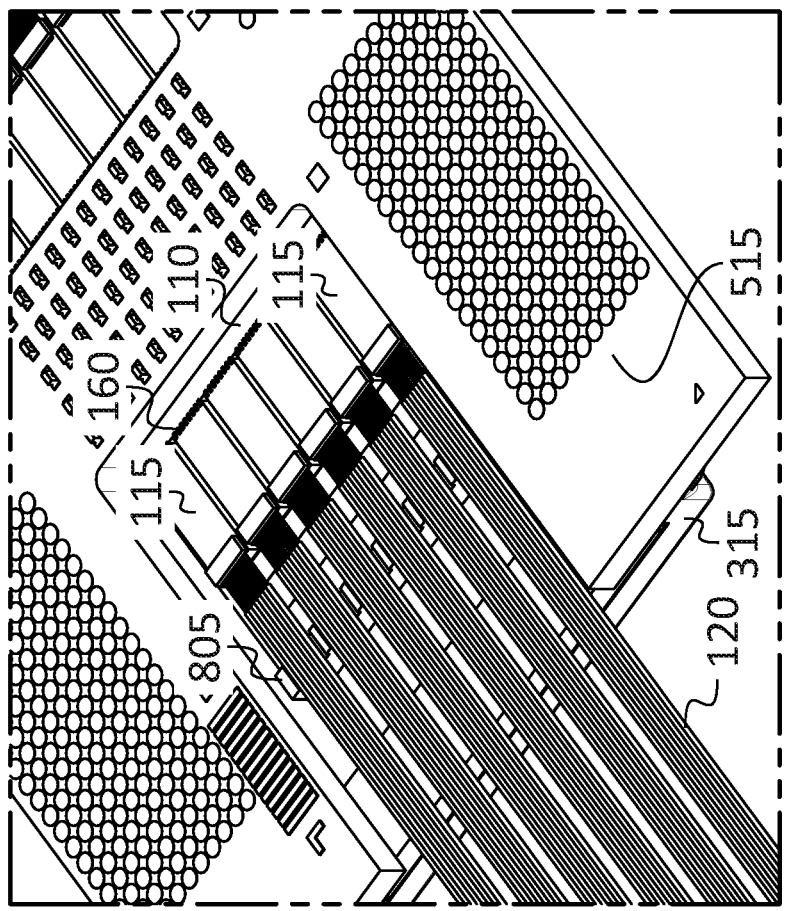
FIG. 23 is an enlarged perspective view of a portion of a module, according to an embodiment of the present invention.

FIG. 23 is an enlarged view of a portion of FIG. 16C. As mentioned above, in this embodiment, each of the photonic integrated circuits 115 includes V-grooves, and a separate V-groove block and a reinforcing block are not used. Instead the fiber ends are placed in the V-grooves of the photonic integrated circuit 115, clamped and bonded in place with, e.g., a glass lid 145 (or with a polymer lid) and epoxy. In such an embodiment, the fibers may be placed and bonded into the V-grooves either before or after connections are made to the photonic integrated circuit.

As used herein, a "photonic chip" is any part consisting of a substrate having an upper surface, and layers, features, and/or devices, including at least one optical waveguide, fabricated in the upper layers of the substrate. Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

Although exemplary embodiments of a module including an electronic integrated circuit and having optical data ports have been specifically described and illustrated herein, many modifications and variations will be apparent to those skilled in the art. Accordingly, it is to be understood that a module including an electronic integrated circuit and having optical data ports constructed according to principles of this invention may be embodied other than as specifically described herein. The invention is also defined in the following claims, and equivalents thereof.

What is claimed is:

1. A module, comprising:
   a substrate having a top surface and a bottom surface and comprising a plurality of conductive traces and a first plurality of contacts, each of the contacts being on the top surface of the substrate and electrically connected to a corresponding conductive trace of the plurality of conductive traces;
   an electronic complementary metal oxide integrated circuit having a top surface and a bottom surface, and comprising:
      a second plurality of contacts on the bottom surface of the electronic integrated circuit;
      a first plurality of wire bond pads at a first edge of the bottom surface of the electronic integrated circuit; and
      a second plurality of wire bond pads at a second edge, opposite the first edge, of the bottom surface of the electronic integrated circuit,
   the second plurality of contacts being between the first plurality of wire bond pads and the second plurality of wire bond pads,
   each of the contacts of the second plurality of contacts being vertically aligned with and connected to a corresponding contact of the first plurality of contacts,
   wherein:
      the substrate covers the second plurality of contacts,
      the substrate does not cover the first plurality of wire bond pads, and
      the substrate does not cover the second plurality of wire bond pads.

2. The module of claim 1, wherein:
   each contact of the first plurality of contacts is secured to a contact of the second plurality of contacts with solder.

3. The module of claim 1, wherein the module further comprises:
   a first plurality of photonic integrated circuit assemblies, each of the first plurality of photonic integrated circuit assemblies having a wire bond pad adjacent to a wire bond pad of the first plurality of wire bond pads; and
   a plurality of wire bonds, each of the wire bonds connecting a wire bond pad of a photonic integrated circuit assembly of the first plurality of photonic integrated circuit assemblies to a wire bond pad of the first plurality of wire bond pads.

4. The module of claim 3, further comprising:
   a second plurality of photonic integrated circuit assemblies, each of the second plurality of photonic integrated circuit assemblies having a wire bond pad adjacent to a wire bond pad of the second plurality of wire bond pads; and
   a plurality of wire bonds, each of the wire bonds connecting a wire bond pad of a photonic integrated circuit assembly of the second plurality of photonic integrated circuit assemblies to a wire bond pad of the second plurality of wire bond pads.

5. The module of claim 1, further comprising:
   a plurality of photonic integrated circuit assemblies, each of the plurality of photonic integrated circuit assemblies having a wire bond pad adjacent to a wire bond pad of the first plurality of wire bond pads,
   wherein a photonic integrated circuit assembly of the plurality of photonic integrated circuit assemblies comprises:
      a photonic integrated circuit; and
      a mode converter adjacent to the photonic integrated circuit and configured to convert between an optical mode of the photonic integrated circuit and an optical mode of an optical fiber,
   wherein the wire bond pad of the photonic integrated circuit assembly is on the photonic integrated circuit.

6. The module of claim 1, wherein the substrate is an organic substrate.

7. The module of claim 1, wherein the substrate has the shape of an H.

8. The module of claim 1, wherein a contact of the first plurality of contacts is secured to a contact of the second plurality of contacts with a connection selected from the group consisting of a copper pillar and a thermocompression stud bump.

9. The module of claim 1, further comprising:
   a plurality of photonic integrated circuit assemblies, each of the plurality of photonic integrated circuit assemblies having a wire bond pad adjacent to a wire bond pad of the first plurality of wire bond pads,
   wherein a photonic integrated circuit assembly of the plurality of photonic integrated circuit assemblies comprises:
      a V-groove block having a V-groove securing an optical fiber; and
      a photonic integrated circuit comprising the wire bond pad,
   wherein the photonic integrated circuit has an optical aperture aligned with the optical fiber, and comprises a mode converter configured to convert between an optical mode of the photonic integrated circuit and an optical mode of the optical fiber.

10. The module of claim 1, further comprising:
    a plurality of photonic integrated circuits, each of the plurality of photonic integrated circuits having a wire bond pad adjacent to a wire bond pad of the first plurality of wire bond pads, wherein a photonic integrated circuit of the plurality of photonic integrated circuits has a V-groove securing an optical fiber.

11. The module of claim 1, further comprising an upper cover, and having a thermal path, with a thermal resistance of less than 0.1° C./W, between the bottom surface of the electronic integrated circuit and an exterior surface of the upper cover.

12. The module of claim 11, wherein the upper cover comprises, on an interior surface of the upper cover, a pedestal, the pedestal being part of the thermal path.

13. The module of claim 11, further comprising a plurality of photonic integrated circuit assemblies, each of the plurality of photonic integrated circuit assemblies being secured to the upper cover.

14. The module of claim 13, wherein the photonic integrated circuit assemblies are secured to a carrier, and the carrier is secured to the upper cover.

15. The module of claim 14, wherein the carrier has a thermal resistance, between any one of the photonic integrated circuit assemblies and the exterior surface of the upper cover, of at least 10° C./W.

16. The module of claim 1, wherein:
the substrate has an otherwise convex shape with one or more cutouts;
a first cutout of the one or more cutouts is over the first plurality of wire bond pads; and
the first cutout is configured to allow the formation of wire bonds to the first plurality of wire bond pads when the electronic integrated circuit is secured to the substrate.

17. The module of claim 1, wherein:
the substrate further comprises a fifth plurality of contacts, on the bottom surface of the substrate, opposite the top surface of the substrate; and
the contacts of the fifth plurality of contacts form a land grid array.

18. The module of claim 1, further comprising:
a plurality of photonic integrated circuit assemblies, each of the plurality of photonic integrated circuit assemblies having a wire bond pad adjacent to a wire bond pad of the first plurality of wire bond pads;
a first heater, in thermal contact with a first photonic integrated circuit of a photonic integrated circuit assembly of the plurality of photonic integrated circuit assemblies; and
a temperature sensor, in thermal contact with the first photonic integrated circuit.

19. The module of claim 1, further comprising:
a plurality of photonic integrated circuit assemblies, each of the plurality of photonic integrated circuit assemblies having a wire bond pad adjacent to a wire bond pad of the first plurality of wire bond pads;
a first heater, integral with a first photonic integrated circuit of a photonic integrated circuit assembly of the plurality of photonic integrated circuit assemblies; and
a temperature sensor, integral with the first photonic integrated circuit.

* * * * *